US009882018B2

(12) United States Patent
Noh et al.

(10) Patent No.: US 9,882,018 B2
(45) Date of Patent: Jan. 30, 2018

(54) SEMICONDUCTOR DEVICE WITH A TUNNELING LAYER HAVING A VARYING NITROGEN CONCENTRATION, AND METHOD OF MANUFACTURING THE SAME

(71) Applicants: Young Jin Noh, Suwon-si (KR); Jae Ho Choi, Suwon-si (KR); Bio Kim, Seoul (KR); Kwang Min Park, Seoul (KR); Jae Young Ahn, Seongnam-si (KR); Dong Chul Yoo, Seongnam-si (KR); Seung Hyun Lim, Seoul (KR); Jeon Il Lee, Suwon-si (KR)

(72) Inventors: Young Jin Noh, Suwon-si (KR); Jae Ho Choi, Suwon-si (KR); Bio Kim, Seoul (KR); Kwang Min Park, Seoul (KR); Jae Young Ahn, Seongnam-si (KR); Dong Chul Yoo, Seongnam-si (KR); Seung Hyun Lim, Seoul (KR); Jeon Il Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 153 days.

(21) Appl. No.: 14/713,039

(22) Filed: May 15, 2015

(65) Prior Publication Data
US 2016/0043179 A1    Feb. 11, 2016

(30) Foreign Application Priority Data

Aug. 6, 2014    (KR) ......................... 10-2014-0101114

(51) Int. Cl.
*H01L 29/51*    (2006.01)
*H01L 29/792*    (2006.01)
(Continued)

(52) U.S. Cl.
CPC ...... *H01L 29/518* (2013.01); *H01L 27/11582* (2013.01); *H01L 29/4234* (2013.01);
(Continued)

(58) Field of Classification Search
CPC ..................... H01L 27/11582; H01L 29/7883
See application file for complete search history.

(56) References Cited

U.S. PATENT DOCUMENTS 6,207,506 B1    3/2001    Yi et al.
8,063,435 B2    11/2011    Cho
(Continued)

FOREIGN PATENT DOCUMENTS

| JP | 10189775 A | 7/1998 |
| JP | 2000232170 A | 8/2000 |
| KR | 100716640 B1 | 5/2007 |

*Primary Examiner* — Thao X Le
*Assistant Examiner* — Geoffrey Ida
(74) *Attorney, Agent, or Firm* — Volentine & Whitt, PLLC

(57) ABSTRACT

A semiconductor device includes: a substrate including a channel region; a gate dielectric a tunneling layer, a charge storage layer, and a blocking layer sequentially disposed on the channel region; and a gate electrode disposed on the gate dielectric, wherein the tunneling layer has variations in nitrogen concentrations in a direction perpendicular to the channel region, and has a maximum nitrogen concentration in a position shifted from a center of the tunneling layer toward the charge storage layer.

18 Claims, 23 Drawing Sheets

(51) Int. Cl.
    *H01L 29/788*     (2006.01)
    *H01L 27/11582*     (2017.01)
    *H01L 29/423*     (2006.01)
    *H01L 27/11556*     (2017.01)

(52) U.S. Cl.
    CPC ........ *H01L 29/7883* (2013.01); *H01L 29/792* (2013.01); *H01L 27/11556* (2013.01)

(56) References Cited

U.S. PATENT DOCUMENTS

| | | |
|---|---|---|
| 8,254,175 B2 | 8/2012 | Higuchi et al. |
| 2003/0003656 A1* | 1/2003 | Dong ................ H01L 21/28273 438/257 |
| 2007/0023814 A1* | 2/2007 | Cho .................. H01L 29/42324 257/314 |
| 2008/0093658 A1 | 4/2008 | Shiozawa et al. |
| 2009/0321809 A1 | 12/2009 | Ramaswamy et al. |
| 2010/0025752 A1* | 2/2010 | Dong ................ H01L 21/28273 257/324 |
| 2010/0157680 A1* | 6/2010 | Higuchi ............ H01L 21/28282 365/185.18 |
| 2011/0073935 A1 | 3/2011 | Sekihara et al. |
| 2013/0273728 A1* | 10/2013 | Kim .................. H01L 27/11521 438/591 |

* cited by examiner

US 9,882,018 B2

SEMICONDUCTOR DEVICE WITH A TUNNELING LAYER HAVING A VARYING NITROGEN CONCENTRATION, AND METHOD OF MANUFACTURING THE SAME

PRIORITY STATEMENT

This application claims priority to Korean Patent Application No. 10-2014-0101114 filed on Aug. 6, 2014, with the Korean Intellectual Property Office, the disclosure of which is hereby incorporated by reference in its entirety.

BACKGROUND

The present disclosure relates to semiconductor devices. In particular, the present disclosure relates to the gate dielectrics of semiconductor devices and to the manufacturing of semiconductor devices having gate dielectrics.

Electronic products must continue to store mass amounts of data and maintain the integrity of that data despite demands for the products to be further miniaturized. Thus, there is a need to increase the degree of integration of semiconductor devices used in electronic products. A semiconductor device having a vertical transistor structure instead of a planar transistor structure has been developed as one way to provide higher degrees of integration within the same footprint.

SUMMARY

According to an aspect of the inventive concept, there is provided a semiconductor device including a channel region, a gate dielectric including a tunneling layer, a charge storage layer and a blocking layer disposed on a surface the channel region in the foregoing order, and a gate electrode disposed on the gate dielectric, and in which the tunneling layer comprises nitrogen throughout, the nitrogen concentration of the tunneling layer varies along an axis normal to the surface of the channel region, and the nitrogen concentration of the tunneling layer is maximum at location offset from a center of the tunneling layer, in said direction, toward the charge storage layer.

According to another aspect of the inventive concept, there is provided a semiconductor device including a stack of alternately disposed gate electrodes and interlayer insulating layers on a substrate, channel regions extending through the stack, and a gate dielectric including a tunneling layer, a charge storage layer, and a blocking layer stacked in the foregoing order around a vertical surface of each of the channel regions, and in which the tunneling layer of the gate dielectric comprises nitrogen throughout, the nitrogen concentration of the tunneling layer varies along an axis normal to the vertical surface of the channel region, and the nitrogen concentration of the tunneling layer is maximum at location offset from a center of the tunneling layer, along said axis, toward the charge storage layer.

According to another aspect of the inventive concept, there is provided a semiconductor device including a channel region of semiconductor material, a gate electrode, and a tunneling layer, a charge storage layer and a blocking layer collectively interposed between a surface the channel region and the gate electrode, and in which the tunneling layer is interposed between the charge storage layer and the channel region, the blocking layer is interposed between the charge storage layer and the gate electrode, the tunneling layer comprises nitrogen throughout, the nitrogen concentration of the tunneling layer varies substantially in a direction from the charge storage layer to the channel region, said direction coinciding with the direction of thickness of the tunneling layer, and the nitrogen concentration of the tunneling layer is maximum at location in the tunneling layer between the center of the tunneling layer, in the direction of its thickness, and the charge storage layer.

BRIEF DESCRIPTION OF DRAWINGS

The above and other aspects, features and advantages of the inventive concept will be more clearly understood from the following detailed description of preferred embodiments taken in conjunction with the accompanying drawings, in which.

DETAILED DESCRIPTION OF THE PREFERRED EMBODIMENTS

Figure 1:
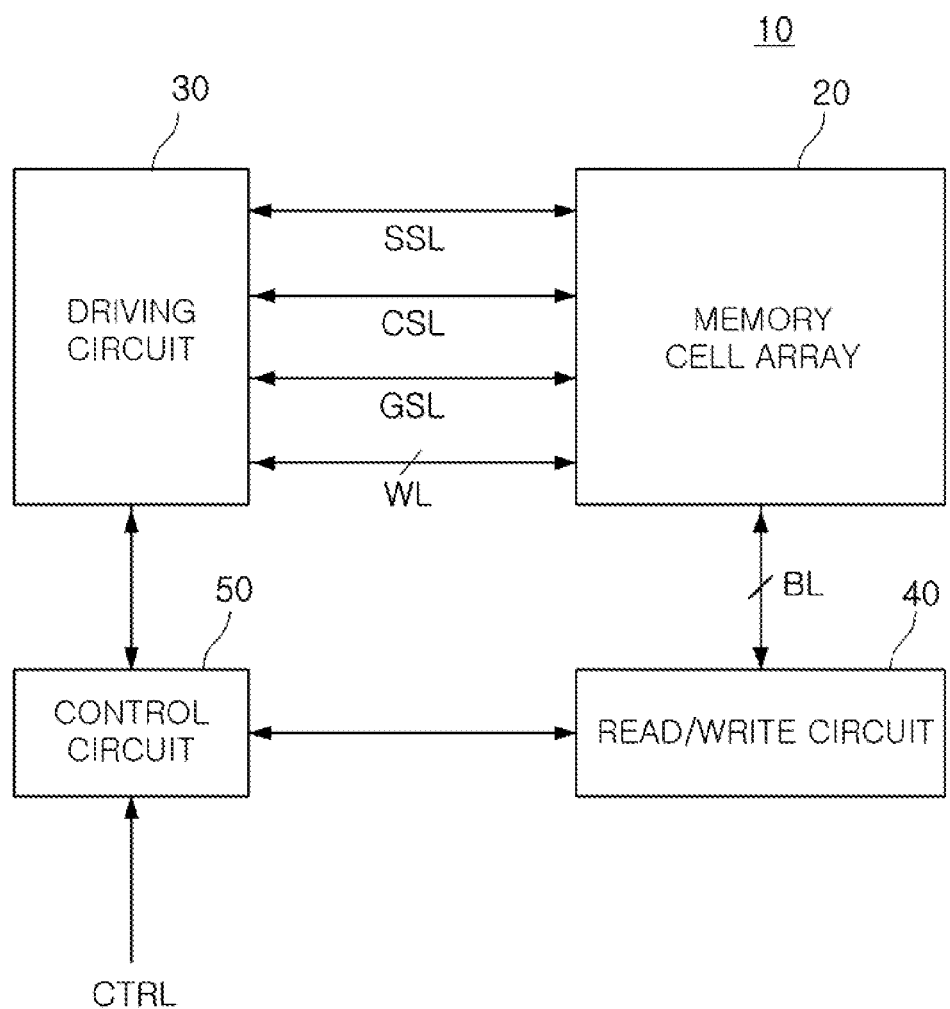
FIG. 1 is a block diagram of a semiconductor device according to the present inventive concept.

Exemplary embodiments of the present inventive concept will now be described in detail with reference to the accompanying drawings.

The inventive concept may, however, be embodied in many different forms and should not be construed as being limited to the specific embodiments set forth herein. Rather, these embodiments are provided so that this inventive concept will be thorough and complete, and will fully convey the scope of the inventive concept to those skilled in the art.

In the drawings, the shapes and dimensions of elements may be exaggerated for clarity, and the same reference numerals will be used throughout to designate the same or like elements.

Furthermore, the terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes. The term "extending" in a particular direction when used to describe an element or feature will generally indicate that such direction corresponds to a lengthwise or longest dimension of that element or feature. The term "on" may refer to not only on in a vertical sense but in a manufacturing sense. For example, in the case of a vertical structure, a layer that is formed on such a vertical structure may merely extend around that structure as a result of the way it is made as will be clear from the context in which the term "on" is used. Also, the term "nitrogen concentration" of a particular region or layer may refer to the average nitrogen concentration, i.e., the average nitrogen concentration per unit volume of the region or layer, as portions of this disclosure (e.g., the graphs of nitrogen concentration distributions) make clear.

An exemplary embodiment of a semiconductor device 10 to which the present inventive concept may be applied will now be described with reference to FIG. 1.

Semiconductor device 10 may include a memory cell array 20, a driving circuit 30, a read/write circuit 40, and a control circuit 50.

The memory cell array 20 may include a plurality of memory cells, and the plurality of memory cells may be arranged in a plurality of columns and rows. The plurality of memory cells of the memory cell array 20 may be connected to the driving circuit 30 through word lines WL/, a common source line CSL, a string select line SSL, a ground select line GSL, or the like, and may be connected to the read/write circuit 40 through bit lines BL/. In exemplary embodiments, a plurality of memory cells arranged in the same row may be connected to the same word line WL, and a plurality of memory cells arranged in the same column may be connected to the same bit line BL.

The memory cells of the memory cell array 20 may be divided into a plurality of memory blocks. Each of the memory blocks may include a plurality of word lines WL, a plurality of string select lines SSL, a plurality of ground select lines GSL, a plurality of bit lines BL, and at least one common source line CSL.

The driving circuit 30 and the read/write circuit 40 may be operated by the control circuit 50. In exemplary embodiments, the driving circuit 30 may receive address information from the control circuit 50, decode the received address information, and select at least some of the word lines WL, the common source lines CSL, the string source lines SSL and the ground select lines GSL connected to the memory cell array 20. The driving circuit 30 may include respective circuitry dedicated to each of the word lines WL, the string select lines SSL, and the common source lines CSL.

The read/write circuit 40 may select at least one of the bit lines BL connected to the memory cell array 20 according to a command received from the control circuit 50. The read/write circuit 40 may read data stored in a memory cell connected to the selected bit line BL or write data to the memory cell connected to the selected bit line BL. In order to perform the foregoing operation, the read/write circuit 40 may include a page buffer, an input/output buffer, and a data latch.

The control circuit 50 may control operations of the driving circuit 30 and the read/write circuit 40 in response to a control signal CTRL transmitted from the outside. In a case of reading data stored in the memory cell array 20, the control circuit 50 may control the operation of the driving circuit 30 to supply a voltage for a read operation to a particular word line WL. When the voltage for a read operation is supplied to the particular word line WL, the control circuit 50 may control the read/write circuit 40 to read data stored in a memory cell connected to the word line WL.

Meanwhile, in a case of writing data to the memory cell array 20, the control circuit 50 may control the operation of the driving circuit 30 to supply a voltage for a write operation to a particular word line. When the voltage for a write operation is supplied to the particular word line WL, the control circuit 50 may control the read/write circuit 40 to write data to a memory cell connected to the word line WL.

Figure 2:
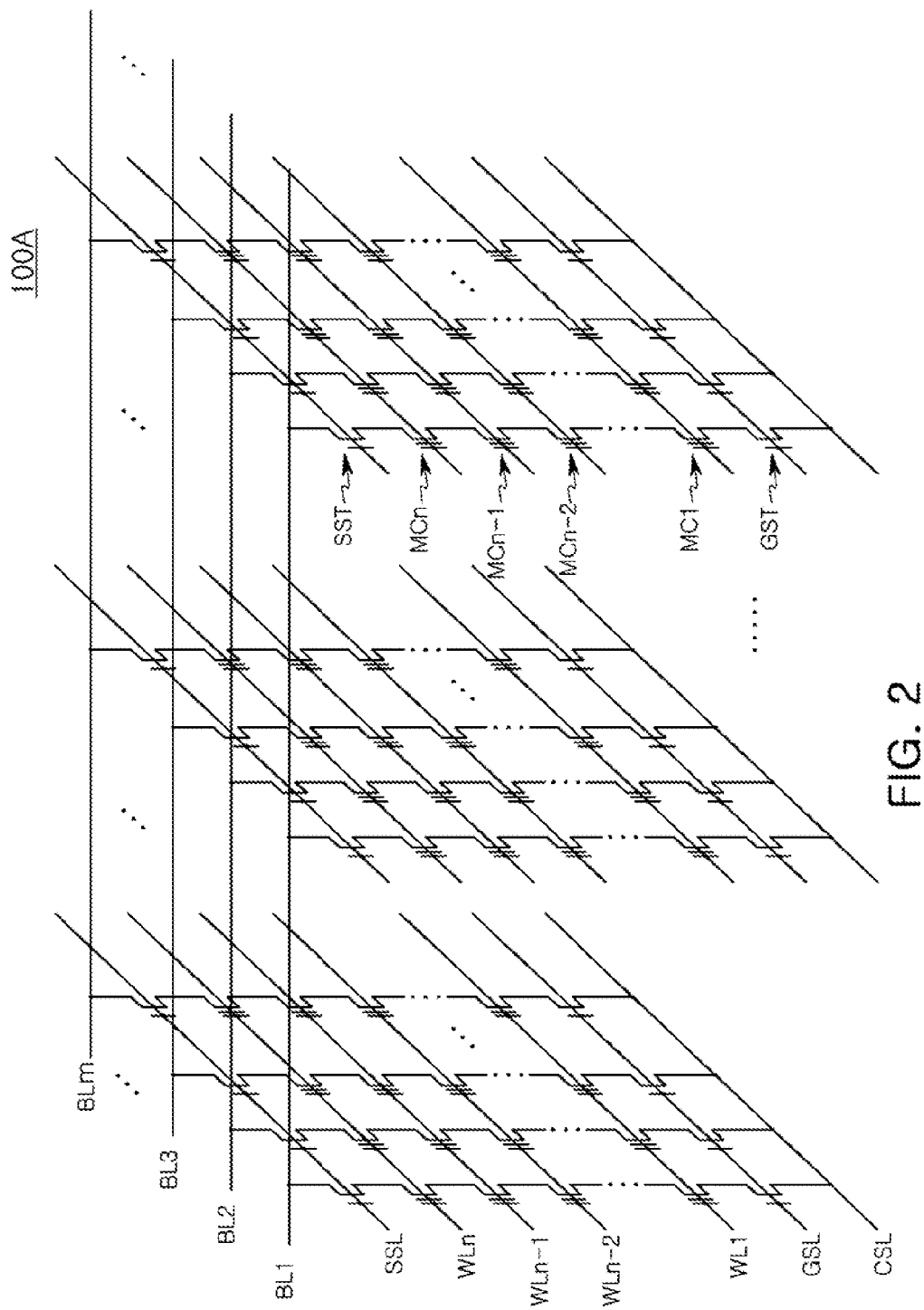
FIG. 2 is an equivalent circuit diagram of an example of part of the semiconductor device of FIG. 1.

The memory cell array 20 and associated lines of the semiconductor device 10 may form a circuit equivalent to that illustrated in FIG. 2.

For example, with reference to FIG. 2, the memory cell array may be a three-dimensional (3D) array of a semiconductor device 100A. More specifically, the memory cell array according to the present exemplary embodiment may include a plurality of memory cell strings, each of which may include n number of memory cells MC1 to MCn connected in series, and a ground select transistor GST and a string select transistor SST connected in series to ends of the outermost memory cells MC1 and MCn in the string.

The n number of series-connected memory cells MC1 to MCn may be connected to the word lines WL1 to WLn, respectively, for selecting at least some of the memory cells MC1 to MCn.

A gate terminal of the ground select transistor GST may be connected to the ground select line GSL, and a source terminal of the ground select transistor GST may be connected to the common source line CSL. Furthermore, a gate terminal of the string select transistor SST may be connected to the string select line SSL, and a source terminal of the string select transistor SST may be connected to a drain terminal of the memory cell MCn. FIG. 2 illustrates a structure in which a single (i.e., only one) ground select transistor GST and a single string select transistor SST are connected to the n number of series-connected memory cells MC1 to MCn; however, alternatively, a plurality of ground select transistors GST or a plurality of string select transistors SST may be connected to the n number of series-connected memory cells MC1 to MCn.

A drain terminal of the string select transistor SST may be connected to one of bit lines BL1 to BLn. When a signal is applied to the gate terminal of the string select transistor SST through the string select line SSL, the applied signal may be transmitted to the n number of series-connected memory cells MC1 to MCn through the bit lines BL1 to BLn to execute a data read or write operation. By applying a signal to the gate terminal of the ground select transistor GST having the source terminal connected to the common source line CSL through the gate select line GSL, an erase operation for removing all electric charges stored in the n number of memory cells MC1 to MCn may be executed.

The structure of a memory cell string of an exemplary embodiment of a semiconductor device 100 according to the present inventive concept will be described in detail with reference to FIG. 3.

Semiconductor device 100 may include a substrate 101, a plurality of channel regions 140 extending in a (z-axis) direction perpendicular to an upper surface of the substrate 101, and a plurality of interlayer insulating layers 120 and a plurality of gate electrodes 130 stacked around outer walls of the channel regions 140. The semiconductor device 100 may further include a gate dielectric GD disposed between the gate electrode 130 and the channel region 140, a common source line 107 disposed on a source region 105, and a drain pad 190 disposed on the top of the channel region 140.

In the semiconductor device 100, a single memory cell string may be formed by and around each channel region 140, and the plurality of memory cell strings may be arranged in rows and columns in x-axis and y-axis directions.

The upper surface of the substrate 101 may extend in the x-axis and y-axis directions. The substrate 101 may include a semiconductor material, such as group IV semiconductor, group III-V compound semiconductor, or group II-VI oxide semiconductor. Examples of group IV semiconductors include silicon, germanium or silicon-germanium. The substrate 101 may be a bulk wafer or comprise an epitaxial layer.

The channel region 140 may be an annular structure surrounding a first insulating layer 182. According to exemplary embodiments, the channel region 140 (along with the first insulating layer 182) may be cylindrical or prismatic, i.e., the outer contour of the cross section of the channel region 140 may be that of a circle or polygon from top to bottom. The channel region 140 may taper in a direction toward the substrate 101 depending on it aspect ratio.

The channel regions 140 may be spaced apart from each other in the x-axis and y-axis directions in an array in which each channel region in a row is aligned with a channel region in each of the other rows to form respective columns of the channel regions. However, the channel regions 140 may be arrayed in other ways. For example, the channel regions 140 may be disposed in an array that has a zigzag pattern. In such an array, for example, the channel regions of each of the other rows are offset, in the direction of the rows (e.g., in the direction of the x-axis), from all of the channel regions in each row adjacent thereto as shown in FIG. 3. The channel regions 140 may be disposed in groups on opposite sides of a second insulating layer 184, and the groups of channel regions 140 may be symmetrical to each other with respect to the second insulating layer 184. At least one of the channel regions 140 may be a dummy channel. In the present specification, and as is the case in the art, the term "dummy" is used to describe an element having the same or similar structure and shape as those of a corresponding element, but which does not perform any significant function in the semiconductor device 100. Therefore, electrical signals are either not transmitted to a 'dummy' element, or the 'dummy' element does not function even when electrical signals are transmitted thereto.

A lower surface of the channel region 140 may be connected to the substrate 101. The channel region 140 may include a semiconductor material such as polycrystalline silicon or single crystalline silicon. The semiconductor material may be an undoped material or may include p-type or n-type impurities.

A plurality of gate electrodes 131 to 138, which are collectively denoted by 130, may be disposed the substrate 101 as spaced apart in the z-axis direction, and extend around the lateral surface of the channel region 140. Referring to FIG. 3 together with FIG. 2, the plurality of gate electrodes 130 may each provide the ground select transistor GST, the plurality of memory cells MC1 to MCn, and the gate terminal of the string select transistor SST. The gate electrodes 130 may be elongated to provide the word lines WL1 to WLn, and may be connected in common to a set of adjacent memory cell strings arranged in the x-axis and y-axis directions. In the figure, five gate electrodes 132 to 136 providing the memory cells MC1 to MCn are shown, but the number of gate electrodes is not limited to five. The number of gate electrodes 130 providing the memory cells MC1 to MCn may be designed for according to the integrity of the semiconductor device 100 that can be realized by providing that many memory cells. For example, the number of gate electrodes 130 providing the memory cells MC1 to MCn may be $2^n$ (where n is a natural number).

The gate electrode 131 of the ground select transistor GST may be elongated in the y-axis direction to provide the ground select line GSL. A portion of the substrate 101 below the gate electrode 131 doped with impurities may constitute part of the ground select transistor GST.

The gate electrodes 137 and 138 of the string select transistors SST may be elongated in the y-axis direction to provide the string select lines SSL. Even more specifically, the gate electrodes 137 and 138 of the string select transistors SST may be divided into groups to form different string select lines SSL between adjacent memory cell strings in the x-axis direction. However, the present inventive concept is not limited thereto. According to exemplary embodiments, the gate electrodes 137 and 138 may be connected to each other between adjacent memory cell strings in the x-axis direction. In this case, the adjacent memory cell strings may be connected to different bit lines BL1 to BLm (see FIG. 2). According to exemplary embodiments, the gate electrodes 137 and 138 of the string select transistor SST and the gate electrode 131 of the ground select transistor GST may have different structures from those of the gate electrodes 132 to 136 of the memory cells MC1 to MCn.

Some gate electrodes 130, e.g., gate electrodes adjacent to the gate electrode 131 of the ground select transistor GST or to the gate electrodes 137 and 138 of the string select transistors SST, may be dummy gate electrodes. For example, the gate electrode 132 adjacent to the gate electrode 131 of the ground select transistor GST may be a dummy gate electrode.

The gate electrodes 130 may comprise polycrystalline silicon or a metal silicide. Examples of the metal silicide include silicides of cobalt (Co), nickel (Ni), hafnium (Hf), platinum (Pt), tungsten (W) and titanium (Ti). According to exemplary embodiments, the gate electrodes 130 may include a metal, e.g., tungsten (W). Although not shown, a diffusion barrier may be provided for the gate electrodes 130. The diffusion barrier includes at least one layer of material selected from the group consisting of tungsten nitride (WN), tantalum nitride (TaN) and titanium nitride (TiN).

Interlayer insulating layers 121 to 129, which are collectively denoted by 120, may be disposed between adjacent ones of the gate electrodes 130, respectively. The interlayer insulating layers 120 may extend in the y-axis direction and be spaced apart from each other in the z-axis direction, like the gate electrodes 130. The interlayer insulating layers 120 may comprise a silicon oxide or a silicon nitride.

The gate dielectric GD may be disposed between the gate electrodes 130 and the channel region 140. As illustrated in an enlarged portion of FIG. 3, the gate dielectric GD may include a tunneling layer 150, a charge storage layer 160, and a blocking layer 170 disposed in the foregoing order around the channel region 140. In the present exemplary embodiment, the gate dielectric GD may extend in parallel to the channel region 140 in the direction perpendicular to the upper surface of the substrate 101.

The tunneling layer 150 may allow charges to tunnel to the charge storage layer 160 using the Fowler-Nordheim (F-N) tunneling mechanism. The tunneling layer 150 may comprise a silicon oxide. Furthermore, the nitrogen (N) concentration of the tunneling layer 150 may vary in the radial direction of the channel region 140 (normal to the surface of the channel region 140 facing the tunneling layer, i.e., in the direction of the x-y plane), and may be maximal at a location offset from the center of the tunneling layer 150 toward the charge storage layer 160 in the radial direction of the channel region. Due to such characteristics of the tunneling layer 150, the erase characteristics may be secured even at a relatively low voltage, and charge loss may be reduced. This will be explained in more detail with reference to FIGS. 5A through 7.

The charge storage layer 160 may be a charge trapping layer or a floating gate conductive layer. For example, the charge storage layer 160 may comprise a dielectric material, quantum dots or nanocrystals. The quantum dots or the nanocrystals may comprise metal particles or fine semiconductor particles. In exemplary embodiments in which the charge storage layer 160 serves as a charge trapping layer, the charge storage layer 160 may be a layer of a silicon nitride.

The blocking layer 170 may comprise a high-k dielectric material. A high-k dielectric material refers to a dielectric material having a dielectric constant higher than that of silicon dioxide.

The drain pad 190 may be disposed at the top of the memory cell string to cover an upper surface of the first insulating layer 182 and to be electrically connected to the channel region 140. The drain pad 190 may comprise doped polycrystalline silicon. The drain pad 190 may serve as the drain terminal of the string select transistor SST (see FIG. 2). The drain pads 190 may be electrically connected to the bit lines BL1 to BLm (see FIG. 2). A conductive contact plug may be disposed between the drain pad 190 and the bit line.

Moreover, the source regions 105 of the ground select transistors GST arranged in the x-axis direction (see FIG. 2) may be disposed at the bottom of the memory cell strings. The source regions 105 may be adjacent the upper surface of the substrate 101 while extending in the y-axis direction and being spaced apart from each other by a predetermined distance in the x-axis direction. Also, for example, a single (common) source region 105 may be provided for every two channel regions 140 in the x-axis direction, but the device is not limited to such an arrangement of source regions. The common source line 107 may extend on the source region 105 in the y-axis direction. The common source line 107 may comprise a conductive material. For example, the common source line 107 may comprise tungsten (W), aluminum (Al) or copper (Cu). The common source line 107 may be electrically isolated from the gate electrodes 130 by the second insulating layer 184.

In a case in which the source region 105 has a conductivity type opposite to that of the substrate 101, the source region 105 may serve as the source terminals of the adjacent ground select transistors GST. In a case in which the source region 105 and the substrate 101 have the same conductivity type, the source region 105 may serve as a pocket P well contact for the erase operation in each of the memory blocks of the memory cell strings. In this case, the common source line 107 may have the form of a contact plug, and as a high voltage is applied to the substrate 101 through the pocket P well contact, data stored in all memory cells of the corresponding memory block may be erased.

Figure 3:
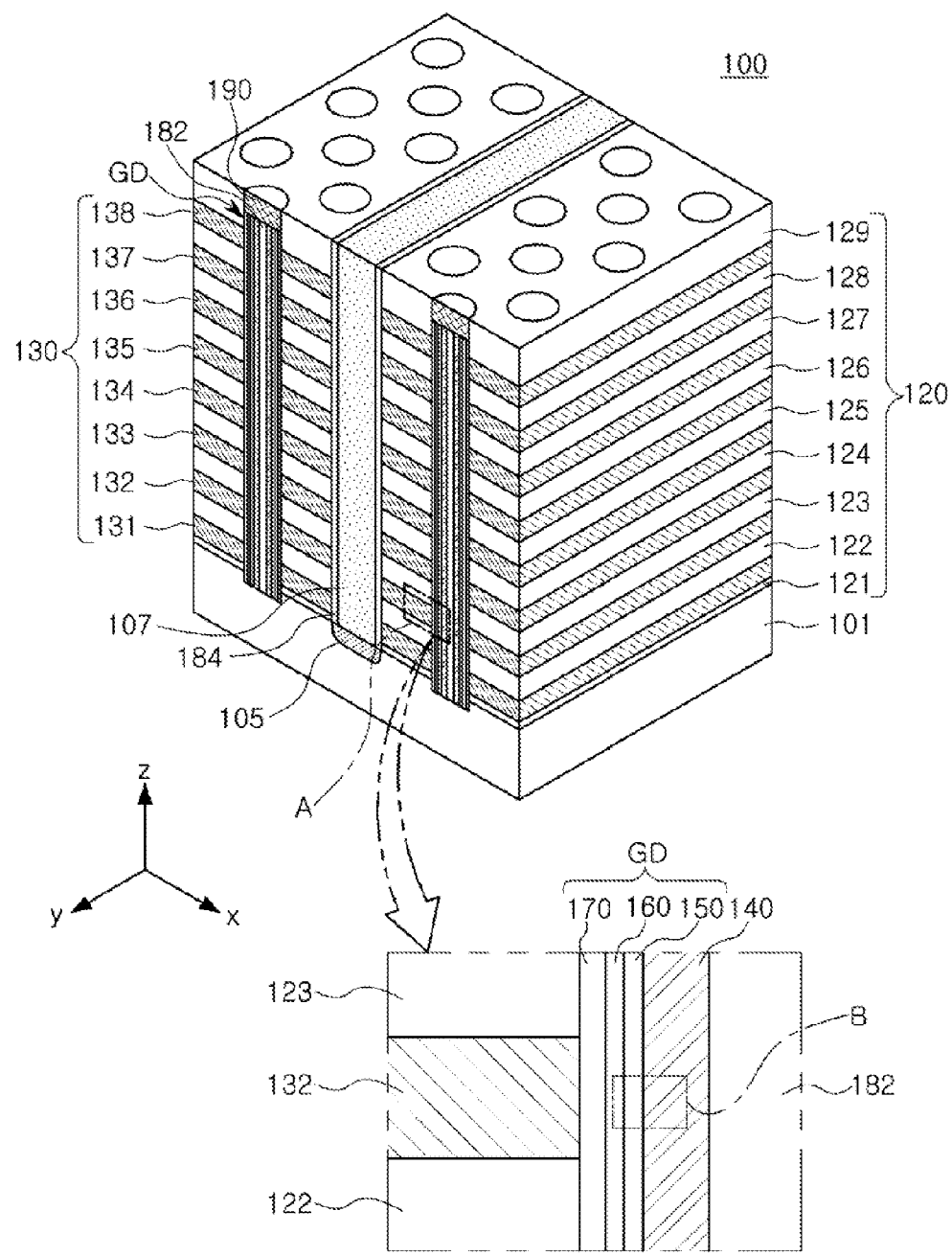
FIG. 3 is a perspective view of a memory cell string structure of an embodiment of a semiconductor device according to the present inventive concept.
Figure 4A:
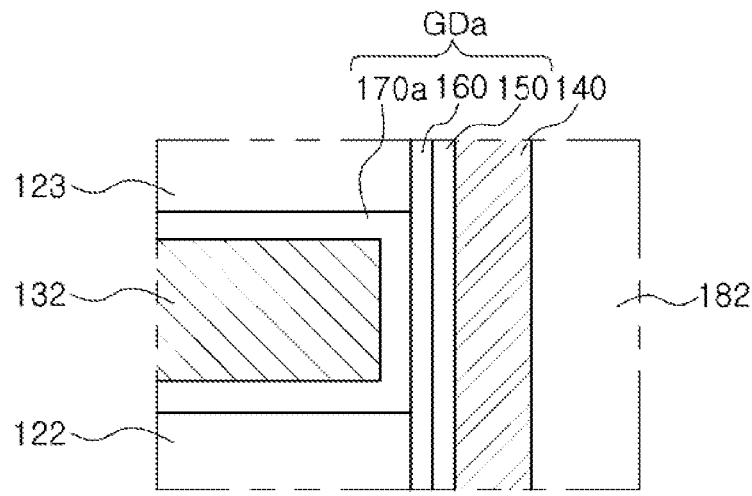
FIGS. 4A, 4B and 4C are cross-sectional views of examples of gate dielectrics according to the present inventive concept, each gate dielectric corresponding to portion A of FIG. 3.
Figure 4B:
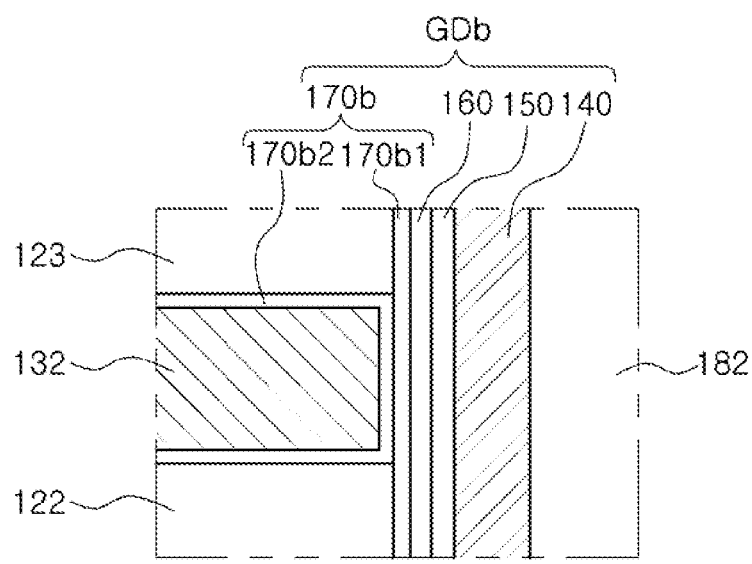
Figure 4C:
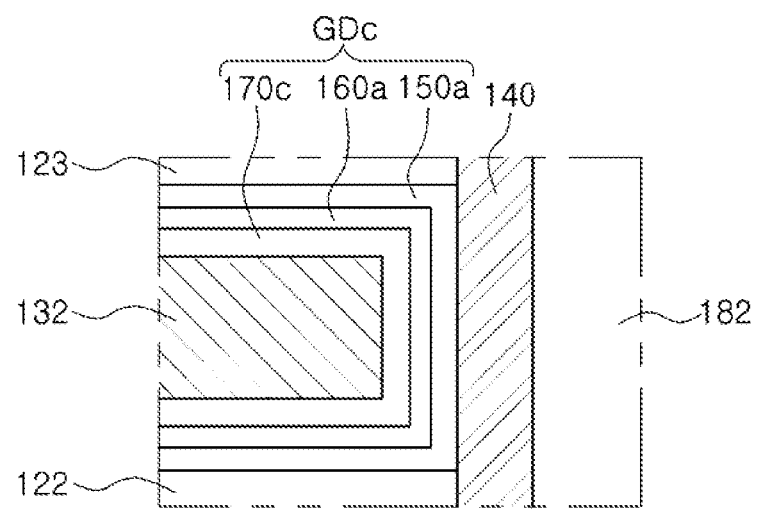

FIGS. 4A through 4C illustrate different examples of the gate dielectrics, each gate dielectric corresponding to portion A of FIG. 3.

FIG. 4A illustrates the gate electrode 132, a gate dielectric GDa and the channel region 140 of a memory cell string. The gate dielectric GDa may have a structure in which the tunneling layer 150, the charge storage layer 160, and a blocking layer 170a are disposed in the foregoing order around the channel region 140. Relative thicknesses of the above layers forming the gate dielectric GDa are not limited to those illustrated in FIG. 4A.

In particular, in the structure of the gate dielectric GDa in the present exemplary embodiment unlike that illustrated in FIG. 3, the tunneling layer 150 and the charge storage layer 160 may extend vertically parallel to the channel region 140, while the blocking layer 170a may surround the gate electrode 132.

The tunneling layer 150 may comprise at least one of a silicon dioxide ($SiO_2$), a silicon nitride ($Si_3N_4$), and a silicon oxynitride (SiON).

The charge storage layer 160 may be a charge trapping layer or a floating gate conductive film. In a case in which the charge storage layer 160 is a floating gate conductive film, the charge storage layer 160 may be formed by depositing polycrystalline silicon through low pressure chemical vapor deposition (LPCVD), for example. In a case in which the charge storage layer 160 is a charge trapping layer, the charge storage layer 160 may comprise at least one of silicon dioxide ($SiO_2$), silicon nitride ($Si_3N_4$), silicon oxynitride (SiON), hafnium oxide ($HfO_2$), zirconium oxide ($ZrO_2$), tantalum oxide ($Ta_2O_3$), titanium oxide ($TiO_2$), a hafnium aluminum oxide ($HfAl_xO_y$), a hafnium tantalum oxide ($HfTa_xO_y$), a hafnium silicon oxide ($HfSi_xO_y$), an aluminum nitride ($Al_xN_y$), and an aluminum gallium nitride ($AlGa_xN_y$).

The blocking layer 170 may comprise silicon dioxide ($SiO_2$), silicon nitride ($Si_3N_4$), silicon oxynitride (SiON), or a high-k dielectric material. The high-k dielectric material may be aluminum oxide ($Al_2O_3$), tantalum oxide ($Ta_2O_3$), titanium oxide ($TiO_2$), yttrium oxide ($Y_2O_3$), zirconium oxide ($ZrO_2$), a zirconium silicon oxide ($ZrSi_xO_y$), hafnium oxide ($HfO_2$), a hafnium silicon oxide ($HfSi_xO_y$), lanthanum oxide ($La_2O_3$), a lanthanum aluminum oxide ($LaAl_xO_y$), a lanthanum hafnium oxide ($LaHf_xO_y$), a hafnium aluminum oxide ($HfAl_xO_y$), or praseodymium oxide ($Pr_2O_3$).

FIG. 4B illustrates the gate electrode 132, a gate dielectric GDb and the channel region 140 of a memory cell string. The gate dielectric GDb may have a structure in which the tunneling layer 150, the charge storage layer 160, and a blocking layer 170b are disposed in the foregoing order around the channel region 140.

In particular, in the structure of the gate dielectric GDb in the present exemplary embodiment unlike those illustrated in FIGS. 3 and 4A, the blocking layer 170b may have first and second sections 170b1 and 170b2, wherein the first section 170b1 may extend vertically parallel to the channel region 140 while the second section 170b2 may surround the gate electrode 132. For example, the first section 170b1 of the blocking layer may be of a relatively low-k dielectric material while the second section 170b2 of the blocking layer may be a relatively high-k dielectric layer. In this case, the semiconductor device may be provided with an energy band by which the characteristics (e.g., erase characteristics) of the device may be enhanced.

FIG. 4C illustrates the gate electrode 132, a gate dielectric GDc and the channel region 140 of a memory cell string. The gate dielectric GDc may have a structure in which a tunneling layer 150a, a charge storage layer 160a, and a blocking layer 170c are disposed in the foregoing order on the channel region 140.

In particular, in the structure of the gate dielectric GDc in the present exemplary embodiment unlike those illustrated in FIGS. 3, 4A and 4B, each of the tunneling layer 150a, the charge storage layer 160a, and the blocking layer 170c may surround the gate electrode 132.

Figure 5A:
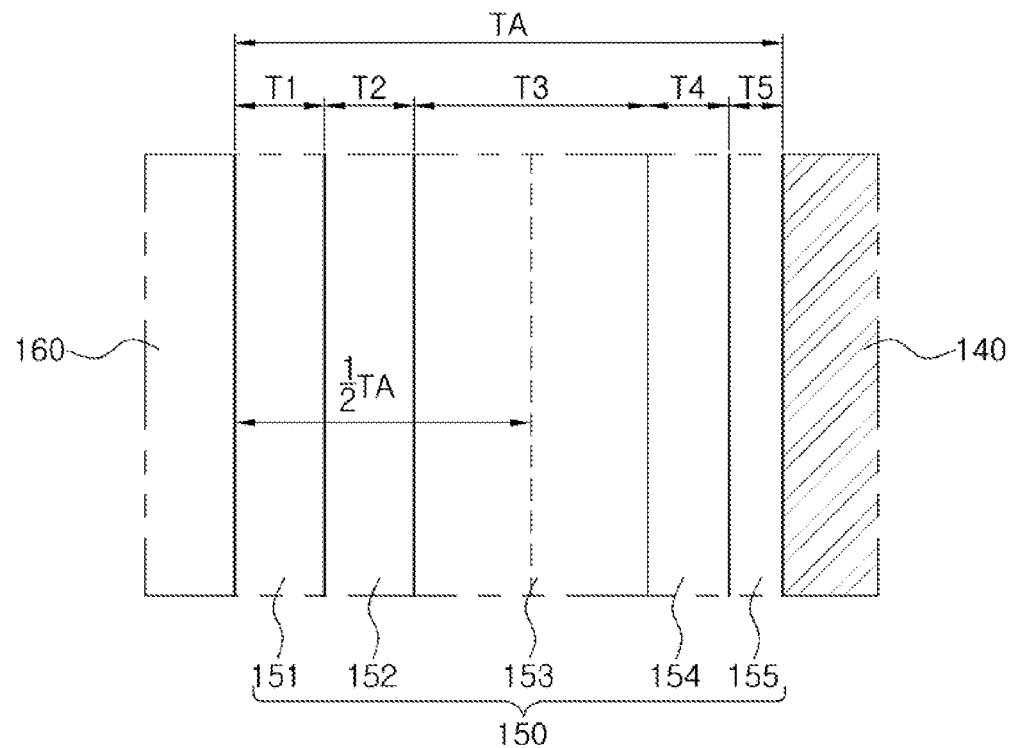
FIGS. 5A and 5B are cross-sectional views of examples of tunneling layers according to the present inventive concept, each tunneling layer corresponding to enlarged portion B of FIG. 3.
Figure 5B:
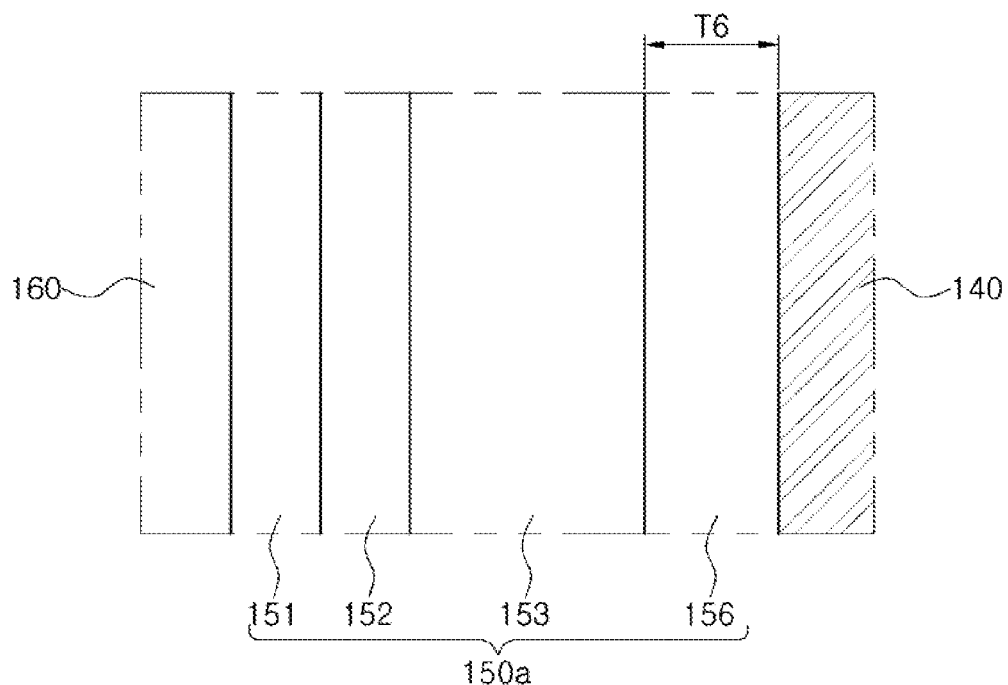

FIGS. 5A and 5B illustrate examples of tunneling layers according to exemplary embodiments, each tunneling layer corresponding to enlarged portion B of FIG. 3.

Referring to FIG. 5A, the tunneling layer 150 may include first to fifth regions 151, 152, 153, 154 and 155 disposed in the foregoing order on the charge storage layer 160. For example, the tunneling layer 150 may be formed of silicon oxynitride (SiON), and the first to fifth regions 151, 152, 153, 154 and 155 of the SiON may have different nitrogen concentrations.

Hereinafter, the number of regions of the tunneling layer 150 considered to have different nitrogen concentrations, for example, the five regions 151, 152, 153, 154 and 155, is somewhat arbitrary in consideration of the manufacturing process. That is, the nitrogen concentrations may vary even within each of the first to fifth regions 151, 152, 153, 154 and 155. This will be described in more detail with reference to FIGS. 6A through 6C.

The second region 152 may have the highest nitrogen concentration, and the third region 153 including the center of the tunneling layer 150 may have the next highest nitrogen concentration after the second region 152.

The first region 151 may be formed of silicon dioxide ($SiO_2$). However, in a case in which the charge storage layer 160 in contact with the first region 151 includes silicon nitride (SiN), the first region 151 may have a nitrogen concentration, but one that is relatively low albeit, due to the diffusion of nitrogen from the charge storage layer 160 or the second region 152 caused by heat during the manufacturing process.

The nitrogen concentration of the fourth region 154 may be lower than the nitrogen concentration of the second and third regions 152 and 153, and may be higher than the nitrogen concentration of the first region 151. The fifth region 155 in contact with the channel region 140 may be formed by the same process (under the same process conditions) as the fourth region 154, but nitrogen may diffuse from the fifth region 155 due to a subsequent heat treatment or the like and thus, the fifth region 155 may have a relatively low nitrogen concentration.

The first to fifth regions 151, 152, 153, 154 and 155 may have first to fifth thicknesses T1, T2, T3, T4 and T5, respectively. The first, second and fourth thicknesses T1, T2 and T4 may be similar to each other, and for example, may range from 5 Å to 15 Å. The third thickness T3 may be larger than the first and second thicknesses T1 and T2, and for example, may range from 20 Å to 32 Å. The fifth thickness T5 may be the smallest among the thicknesses of the first to fifth regions of the tunneling layer 150, and for example, may range from 2 Å to 10 Å. The third layer 153 may be disposed in a region of the tunneling layer 150 including the center thereof in the thickness direction, which is half of the overall thickness TA of the tunneling layer 150, and the second region 152 having the highest nitrogen concentration may be disposed toward the charge storage layer 160 from the center of the tunneling layer 150.

Referring to FIG. 5B, the tunneling layer 150a may include first to fourth regions 151, 152, 153 and 156 in the foregoing order on the charge storage layer 160. In this example, as well, the tunneling layer 150a may be formed of silicon oxynitride (SiON). The first to fourth regions 151, 152, 153 and 156 may have different nitrogen concentrations.

In the present exemplary embodiment, the tunneling layer 150a may include a total of four regions unlike the embodiment of FIG. 5A, and the four regions may be provided with the different nitrogen concentrations using a different manufacturing method. In the present exemplary embodiment, the nitrogen concentration of the fourth region 156 may be lower than the nitrogen concentration of the second and third regions 152 and 153. The nitrogen concentration of the fourth region 156 may be lower or higher than the nitrogen concentration of the first layer 151. The thickness T6 of the fourth layer 156 may be similar to the sum of the fourth and fifth thicknesses T4 and T5 in the embodiment of FIG. 5A.

Figure 6A:
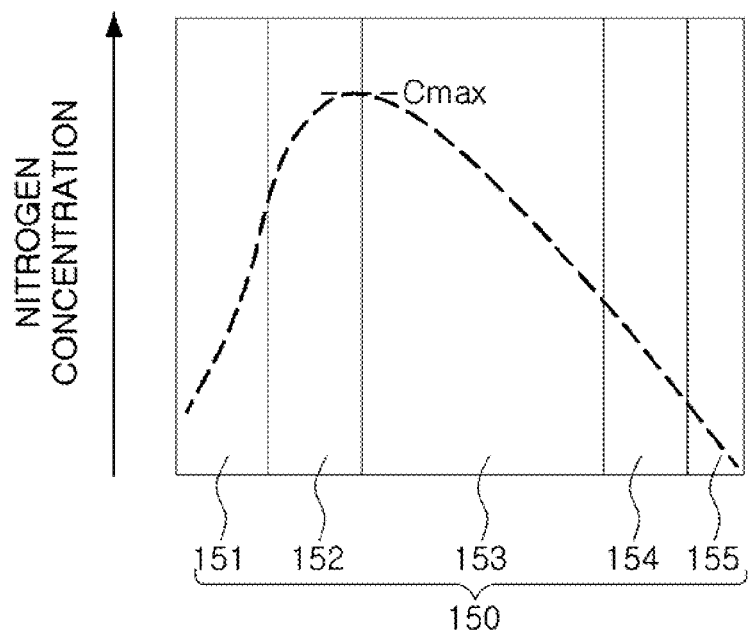
FIGS. 6A through 6C are graphs of examples of nitrogen concentration distributions in the tunneling layer of FIG. 5A according to the present inventive concept.
Figure 6B:
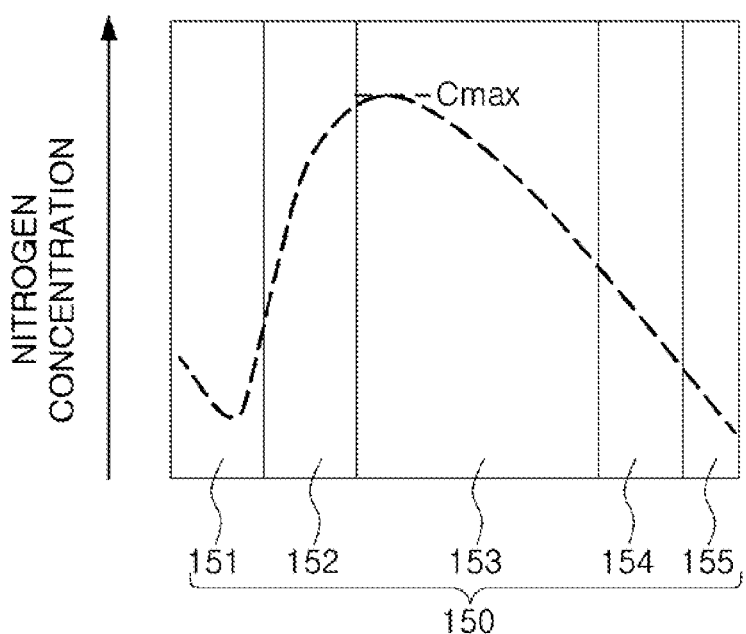
Figure 6C:
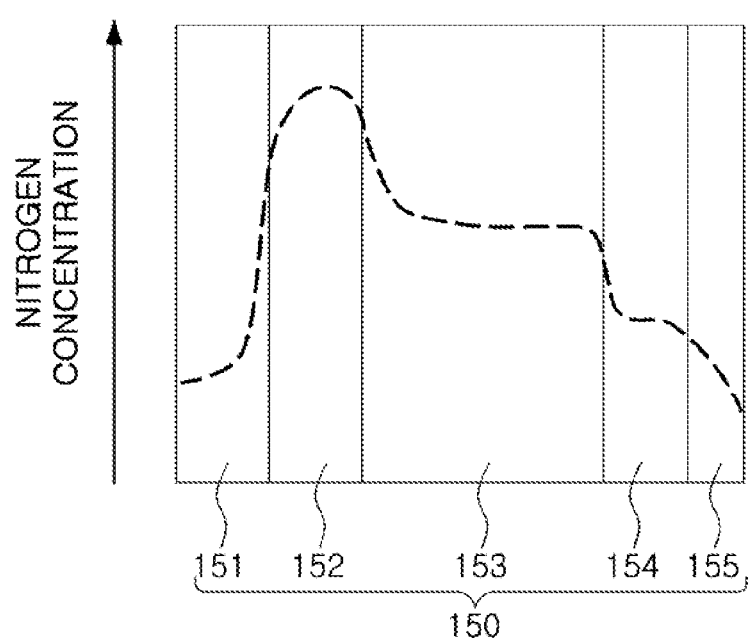

FIGS. 6A through 6C illustrate nitrogen concentration distributions in tunneling layers according to exemplary embodiments. The respective tunneling layers whose nitrogen concentrations are shown in FIGS. 6A through 6C may have the same configuration as that illustrated in FIG. 5A by way of example.

Referring to FIG. 6A, a nitrogen concentration distribution in tunneling layer 150 may increase from the first region 151 to the second region 152 and may decrease from region to region among the third to fifth regions 153, 154 and 155.

The maximum concentration Cmax may be in a region spaced by a distance equal to 25% to 40% of the thickness of the tunneling layer 150 from the surface of the first layer 151 in contact with the charge storage layer 160 (see FIG. 5A). In the present exemplary embodiment, the maximum concentration Cmax may be within the second region 152. In exemplary embodiments, the maximum concentration Cmax may be on or around a boundary between the first region 152 and the third region 153. In a case in which the maximum concentration Cmax is close to the center of the tunneling layer 150, a reduction in erase voltage may be difficult. In a case in which the maximum concentration Cmax is close to the charge storage layer 160, charge loss characteristics may deteriorate due to the loss of electrons.

The second region 152 may have the highest nitrogen concentration, and the nitrogen concentration of the second region 152, namely, the average nitrogen concentration of the second region 152 (average nitrogen concentration per unit volume of the region) may be higher than approximately 22 at. % (atomic percent), and for example, may range from 22 at. % to 28 at. %. Therefore, the maximum concentration Cmax may be higher than 22 at. %, and for example, may range from approximately 25 at. % to 30 at. %. In a case in which the nitrogen concentration and the maximum concentration Cmax of the second region 152 is relatively low, erase efficiency resulting from the movement of holes may not be improved. On the contrary, in a case in which the nitrogen concentration and the maximum concentration Cmax of the second region 152 is relatively high, charge loss characteristics may deteriorate. This will be explained in more detail with reference to FIG. 7.

Referring to FIG. 6B, a nitrogen concentration distribution in the tunneling layer 150 may increase from the first region 151 to the second region 152 and may decrease region to region in the third to fifth regions 153, 154 and 155.

The maximum concentration Cmax may be located in a region spaced by a distance equal to 25% to 40% of the thickness of the tunneling layer 150 from the surface of the first region 151 in contact with the charge storage layer 160. In the present exemplary embodiment, the maximum concentration Cmax may be within the third region 153. Even in this case, the maximum concentration Cmax may be offset from the center of the tunneling layer 150 toward the charge storage layer 160.

Unlike the embodiment of FIG. 6A, the nitrogen concentration may be decrease from the surface of the first region 151 in contact with the charge storage layer 160. This may result from the diffusion of nitrogen from the charge storage layer 160 caused by heat or the like applied thereto during the manufacturing process, in a case in which the charge storage layer 160 includes a silicon nitride (SiN).

Referring to FIG. 6C, a nitrogen concentration distribution in the tunneling layer 150 may increase from the first region 151 to the second region 152 and may decrease from region to region in the third to fifth region 153, 154 and 155.

The maximum concentration Cmax may be located in a region spaced by a distance equal to 25% to 40% of the thickness of the tunneling layer 150 from the surface of the first region 151 in contact with the charge storage layer 160. In the present exemplary embodiment, the maximum concentration Cmax may be within the second layer 152.

Unlike the embodiments of FIGS. 6A and 6B, the nitrogen concentration may rapidly change close boundaries between the first to fifth regions 151, 152, 153, 154, and 155, rather than a gradual change in nitrogen concentration across the entirety of the tunneling layer 150. Therefore, the nitrogen concentration distribution may be represented as a stepped curve.

Figure 7:
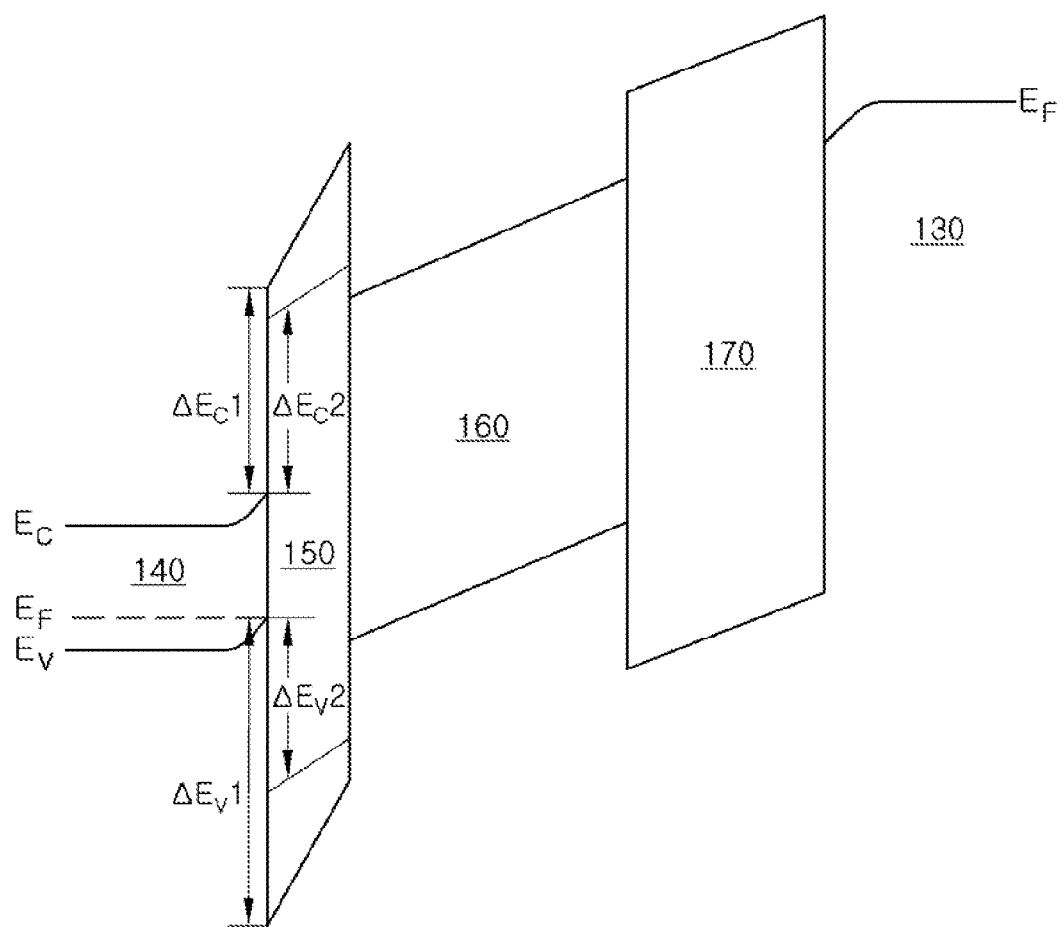
FIG. 7 is a band diagram illustrating an erase operation in a memory cell according to the present inventive concept.

FIG. 7 is a band diagram illustrating an erase operation in an exemplary embodiment of a memory cell according to the present inventive concept.

Referring to FIG. 7, the channel region 140, the tunneling layer 150, the charge storage layer 160, the blocking layer 170 and the gate electrode 130 are illustrated sequentially from the left. In the present exemplary embodiment, the following case is exemplified: the blocking layer 170 uses a high-k dielectric material, and the charge storage layer 160 formed of a silicon nitride serves as a charge trapping layer. Here, thicknesses of regions or layers and a band offset between the regions or layers are merely given by way of example.

Comparative example 1, in which the tunneling layer 150 is formed of silicon dioxide ($SiO_2$), is represented by a dotted line, and comparative example 2, in which the tunneling layer 150 is formed of silicon oxynitride (SiON), is represented by a solid line. A valence band offset $\Delta Ev2$ at an interface between the tunneling layer 150 and the channel region 140 in comparative example 2 is less than that in comparative example 1.

In a case in which the charge storage layer 160 serves as a charge trapping layer, when a high voltage is applied to the channel region 140 so as to perform an erase operation, it is necessary to lower an erase voltage in order to minimize the back tunneling of electrons coming from the gate electrode 130. Accordingly, the injection of holes from the channel region 140 to the charge storage layer 160 becomes important at the time of the erase operation. Hole injection efficiency is related to erase efficiency by holes, and is affected by a valence band offset at the interface between the channel region 140 and the tunneling layer 150. As the valence band offset increases, the hole injection efficiency may be reduced. Therefore, the valence band offset $\Delta Ev2$ in comparative example 2 is comparatively less than the valence band offset $\Delta Ev1$ in comparative example 1, showing that the inventive concept is effective at enhancing the erase characteristics of a semiconductor device.

However, in comparative example 2 in which the tunneling layer 150 is formed of silicon oxynitride (SiON), the nitrogen concentration is higher than that in comparative example 1, and thus the density of trap sites is increased, resulting in deterioration in the charge loss characteristics of the semiconductor device. A conduction band offset $\Delta Ec2$ in comparative example 2 is less than the conduction band offset $\Delta Ec1$ in comparative example 1, showing that a loss of electrons may occur.

Therefore, in exemplary embodiments in which the tunneling layer 150 is formed of silicon oxynitride (SiON) as in comparative example 2, the nitrogen concentration varies across the tunneling layer 150. In exemplary embodiments, a region having a relatively high nitrogen concentration may be formed in the tunneling layer 150 adjacent to the charge storage layer 160, while a region having a relatively low nitrogen concentration may be formed in the tunneling layer 150 adjacent to the channel region 140. Accordingly, the erase characteristics of the semiconductor device may be improved, while the density of trap sites in the region of the tunneling layer 150 adjacent to the channel region 140 may be reduced to thereby secure stability in terms of the charge loss characteristics. A conduction band offset at an interface between the tunneling layer 150 and the charge storage layer 160 may be relatively great, and thus, the loss of electrons may be reduced.

FIGS. 8 through 13 illustrate an exemplary embodiment of a method of manufacturing a semiconductor device according to the present inventive concept.

Figure 8:
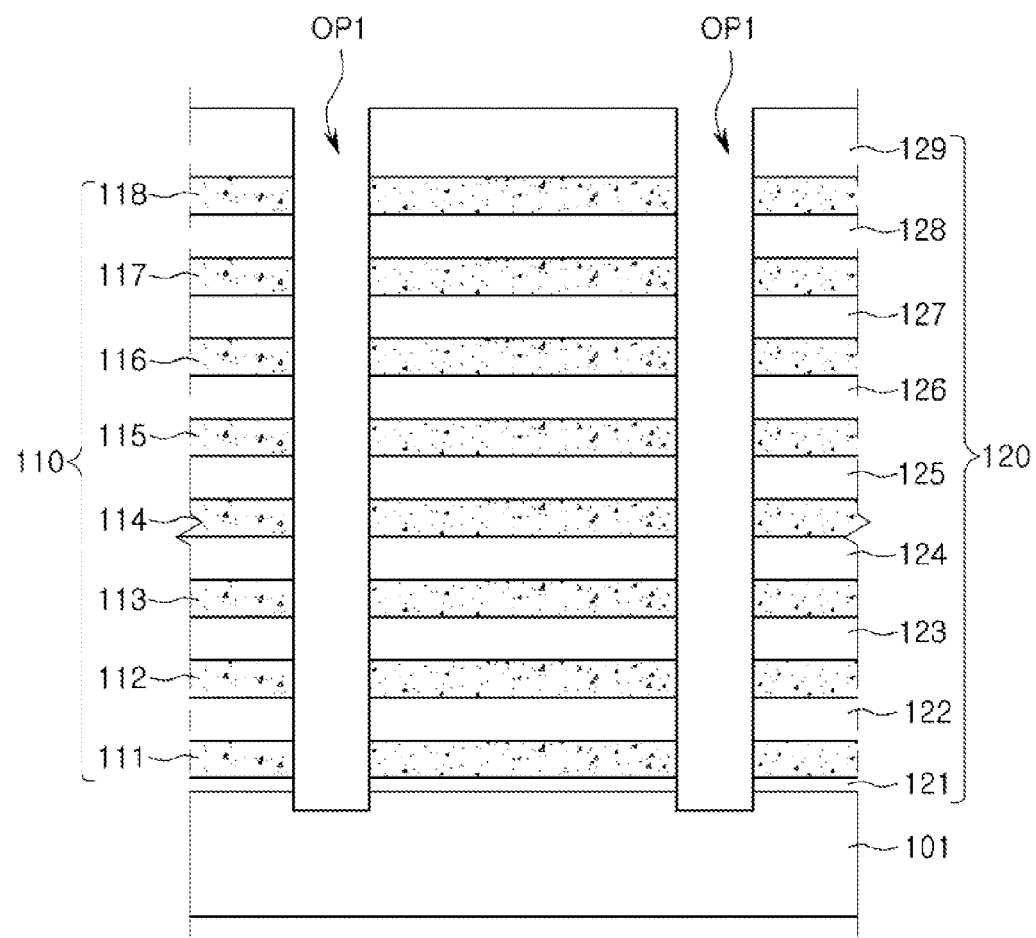
FIGS. 8, 9, 10A, 11, 12 and 13 are sectional views of a semiconductor device during the course of its manufacture and together illustrate an exemplary embodiment of a method of manufacturing such a semiconductor device according to the present inventive concept.

Referring to FIG. 8, interlayer sacrificial layers 111 to 118, which are collectively denoted by 110, and the interlayer insulating layers 120 may be alternately stacked on the substrate 101, and first openings OP1 may be formed through the interlayer sacrificial layers 110 and the interlayer insulating layers 120.

As illustrated, the interlayer insulating layers 120 and the interlayer sacrificial layers 110 may be alternately stacked, starting from a first interlayer insulating layer 121 on the substrate 101. The interlayer sacrificial layers 110 may be formed of a material having etch selectivity with respect to the interlayer insulating layers 120. That is, the interlayer sacrificial layers 110 may be formed of a material that may be selectively etched while minimizing the etching of the interlayer insulating layers 120. Such an etch selectivity or etch selectivity ratio may be quantitatively expressed as a ratio of the etching rate of the interlayer sacrificial layer 110 to the etching rate of the interlayer insulating layers 120. For example, the interlayer insulating layers 120 may include a silicon oxide and/or a silicon nitride, while the interlayer sacrificial layer 110 may be formed of a material different from that of the interlayer insulating layers 120 and selected from among silicon, a silicon oxide, silicon carbide, and a silicon nitride.

In exemplary embodiments, the thicknesses of the interlayer insulating layers 120 may not be the same. Among the interlayer insulating layers 120, a lowermost interlayer insulating layer 121 may be relatively thin, while an uppermost interlayer insulating layer 129 may be relatively thick. In exemplary embodiments, referring to FIG. 2, the interlayer insulating layer 122 disposed between the memory cell and the ground select transistor GST and the interlayer insulating layer 127 disposed between the memory cell and the string select transistor SST may be thicker than the interlayer insulating layers 123 to 126 disposed between the memory cells. The thicknesses of the interlayer insulating layers 120 and the interlayer sacrificial layers 110 may vary from those shown in and described with reference to FIG. 8. The number of layers constituting the interlayer insulating layers 120 and the interlayer sacrificial layers 110 may also vary from those shown in and described with reference to FIG. 8.

In exemplary embodiments, a portion of the substrate 101 below the bottom of a region, in which the gate electrode 131 (see FIG. 3) is to be formed, may be doped with a certain amount of impurities so that a desired electrical function can be provided by that portion of the substrate 101 between the common source line 107 and the ground select transistor GST.

The first openings OP1 may be formed by anisotropically etching the interlayer sacrificial layers 110 and the interlayer insulating layers 120. Portions of the substrate 101 may be removed by this process so that the first openings OP1 extend into the substrate 101, i.e., recesses are formed in the upper surface of the substrate 101. Since a stacked structure including two types of layers is etched, sides of the first openings OP1 may not be perpendicular to the upper surface of the substrate 101. For example, widths or diameters of the first openings OP1 may decrease in a direction toward the upper surface of the substrate 101.

In exemplary embodiments, an epitaxial layer may be further formed in the recesses in the upper surface of the substrate 101. An upper surface of the epitaxial layer may be higher than an upper surface of the interlayer sacrificial layer 111 replaced by the gate electrode 131 of the ground select transistor GST (see FIG. 2).

Figure 9:
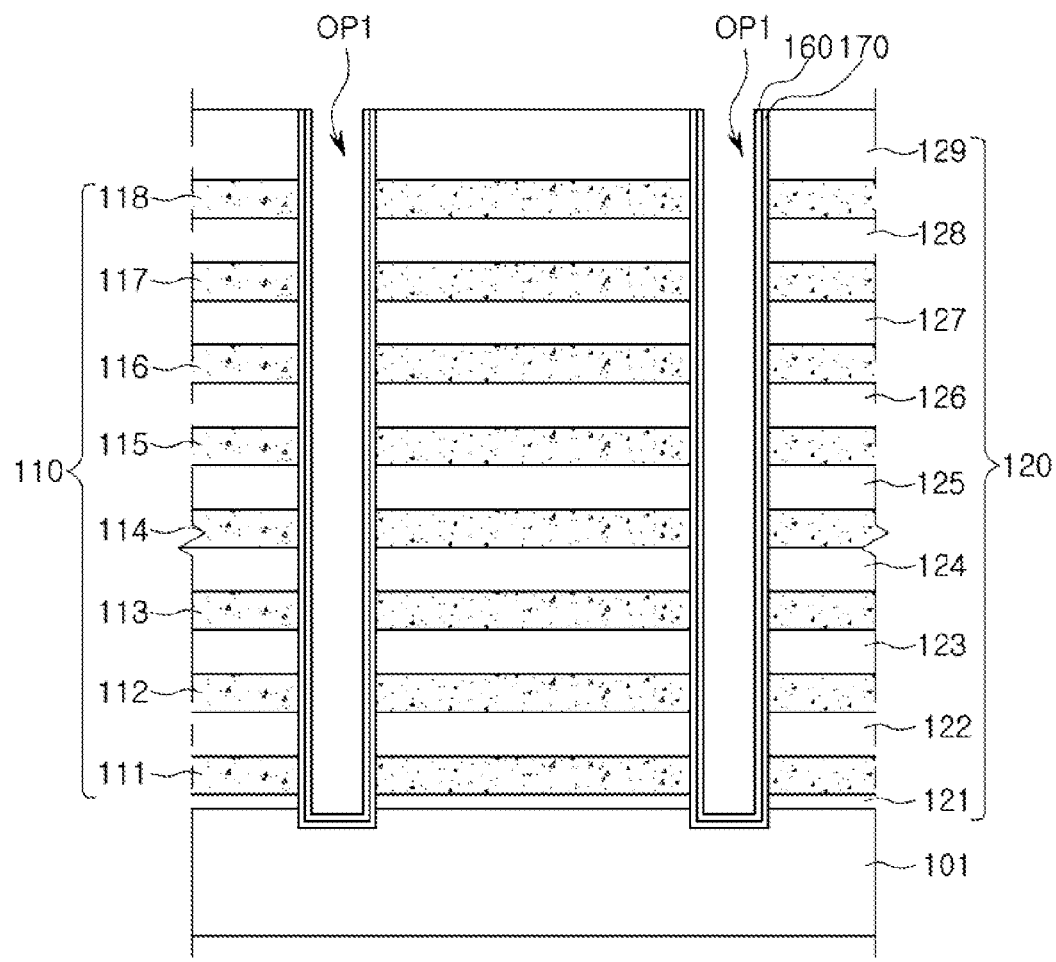

Referring to FIG. 9, the blocking layer 170 and the charge storage layer 160 may be formed inside each of the first openings OP1.

The blocking layer 170 and the charge storage layer 160 may be formed to have a uniform thickness by using atomic layer deposition (ALD) or chemical vapor deposition (CVD).

In exemplary embodiments, at least a portion of the blocking layer 170 and the charge storage layer 160 may be formed in the present process. For example, in the cases of the structures illustrated with reference to FIGS. 4A through 4C, only portions of the gate dielectric extending parallel to the channel region 140 in the direction perpendicular to the substrate 101 may be formed in the present process.

Figure 10A:
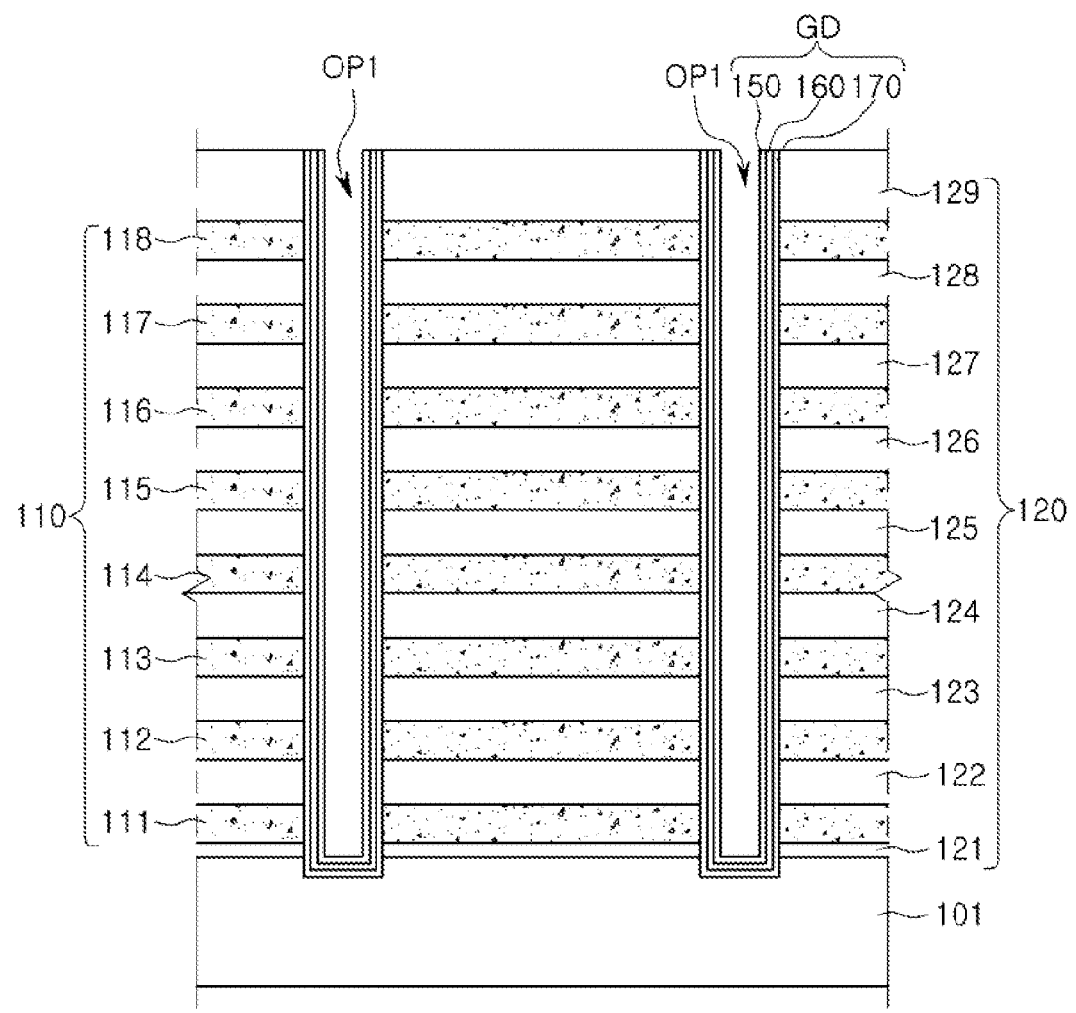
Figure 10B:
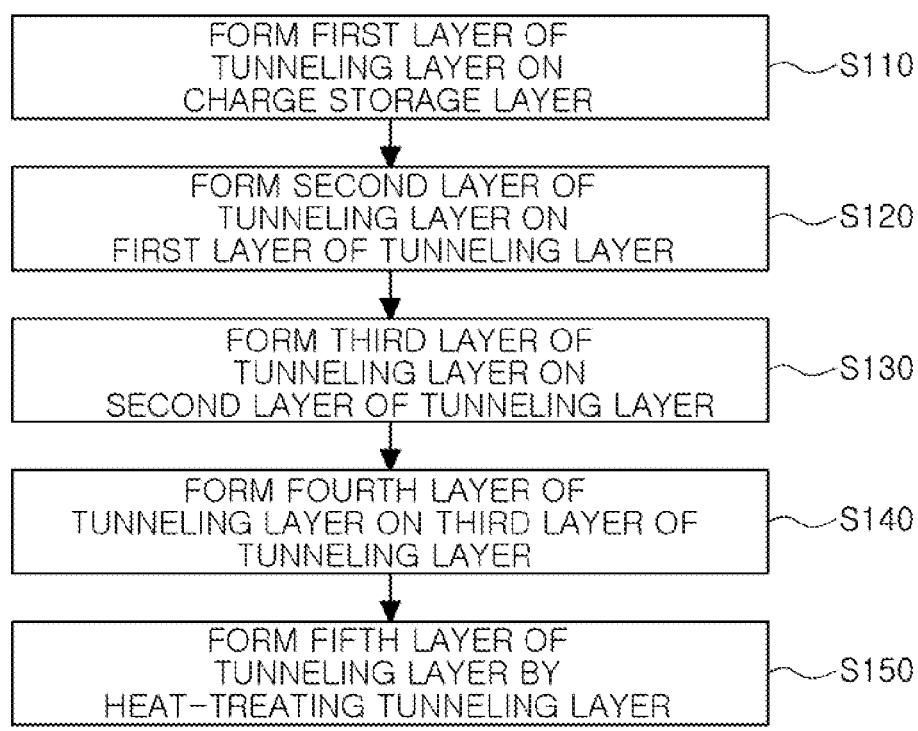
FIG. 10B is a flowchart of a process of forming a tunneling layer in the method of manufacturing a semiconductor device according to the present inventive concept.
Figure 10C:
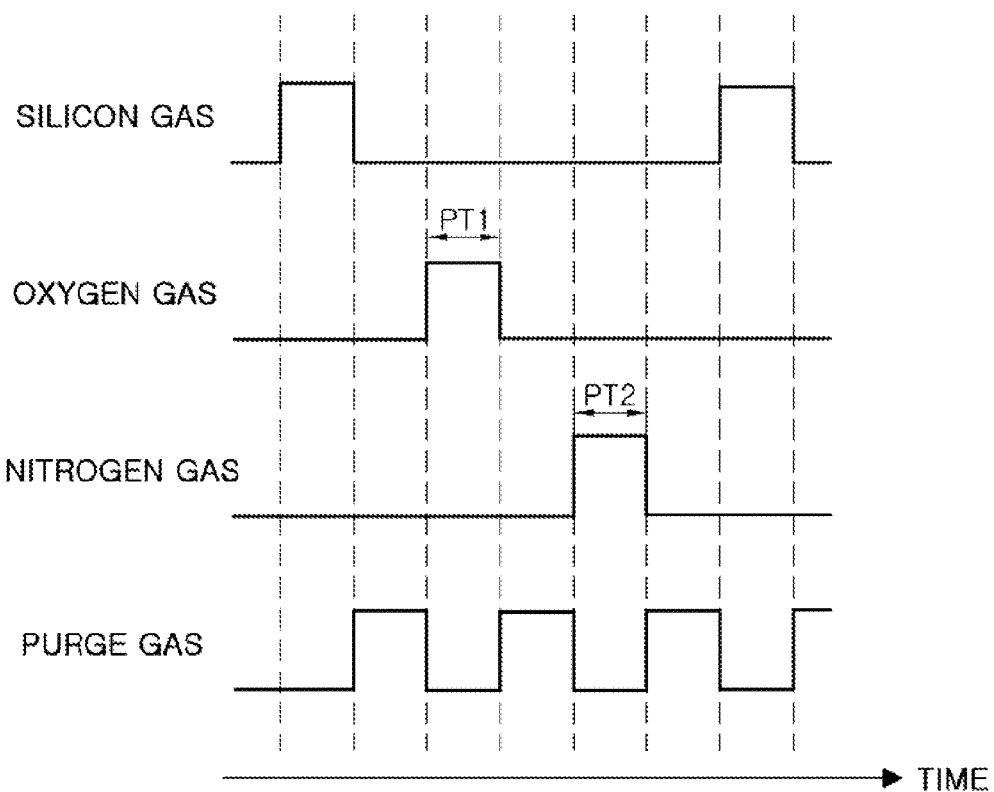
FIG. 10C is a timing and supply diagram for source gases in the process.

Referring to FIGS. 10A through 10C, the tunneling layer 150 may be formed in each of the first openings OP1.

Referring to FIG. 10B together with FIGS. 5A and 6A, the forming of the tunneling layer 150 may include: forming the first region 151 on the charge storage layer 160 (S110); forming the second region 152 on the first layer 151 (S120); forming the third region 153 on the second region 152 (S130); forming the fourth region 154 on the third region 153 (S140); and forming the fifth region 155 on the fourth region 154 (S150). (Note in FIG. 10B, each region of tunneling layer 150 is referred to as its own layer.) By forming the tunneling layer 150, the gate dielectric GD may be completed.

The first to fourth regions 151, 152, 153 and 154 may be formed under different process conditions, and may be formed of silicon oxynitride (SiON) having different nitrogen concentrations, respectively.

The first region 151 may be formed as a silicon dioxide ($SiO_2$) layer. The nitrogen concentration of the second region 152 may be equal to or higher than approximately 22 at. %. The nitrogen concentration of the third region 153 may be lower than the nitrogen concentration of the second region 152, and may range from approximately 17 at. % to 28 at. %. The nitrogen concentration of the fourth region 154 may be lower than the nitrogen concentration of the third region 153, and may be equal to or lower than approximately 23 at. %.

After the first to fourth regions 151, 152, 153 and 154 are formed, a heat treatment may be performed, and then the fifth region 155 having a lower nitrogen concentration than the fourth region 154 may be formed in part of the fourth region 154 (embodiment of FIG. 5A). Alternatively, a region 156 may be formed throughout the entirety of the fourth region 154 essentially replacing the fourth region 154 (embodiment of FIG. 5B). The heat treatment may be performed under an atmosphere containing oxygen ($O_2$), nitrogen ($N_2$) or a combination of oxygen ($O_2$) and hydrogen chloride (HCl). Through the heat treatment, the regions constituting the tunneling layer 150 may be densified, and defects may be cured.

FIG. 10C is a diagram illustrating gas injection flows in a case in which the tunneling layer 150 is formed using ALD.

In order to form the tunneling layer 150, source gases may be sequentially supplied to the interior of a chamber of an ALD device. For example, as illustrated, a silicon source, an oxygen source and a nitrogen source may be sequentially supplied into the chamber. For example, the silicon source, the oxygen source and the nitrogen source may be hexachlorodisilane, nitrous oxide ($N_2O$), and ammonia ($NH_3$), respectively.

After the supply of the aforementioned source gases, a purge gas may be injected, and argon (Ar), helium (He) or nitrogen ($N_2$) may be used as the purge gas. Such a deposition cycle may be repeated multiple times during the forming of the first to fourth regions 151, 152, 153 and 154, so that desired thicknesses of the respective may be obtained.

In particular, the first to fourth regions 151, 152, 153 and 154 may be formed under control of supply amounts or supply time PT1 and PT2 of the oxygen source and the nitrogen source so as to have different nitrogen concentrations. In exemplary embodiments, while the first to fourth regions 151, 152, 153 and 154 may be formed in-situ, at least one of the supply time PT1 of the oxygen source and the supply time PT2 of the nitrogen source may be varied in forming a plurality of the respective regions, thereby changing the nitrogen concentration. In exemplary embodiments, the first to fourth regions 151, 152, 153 and 154 may be formed ex-situ.

Figure 11:
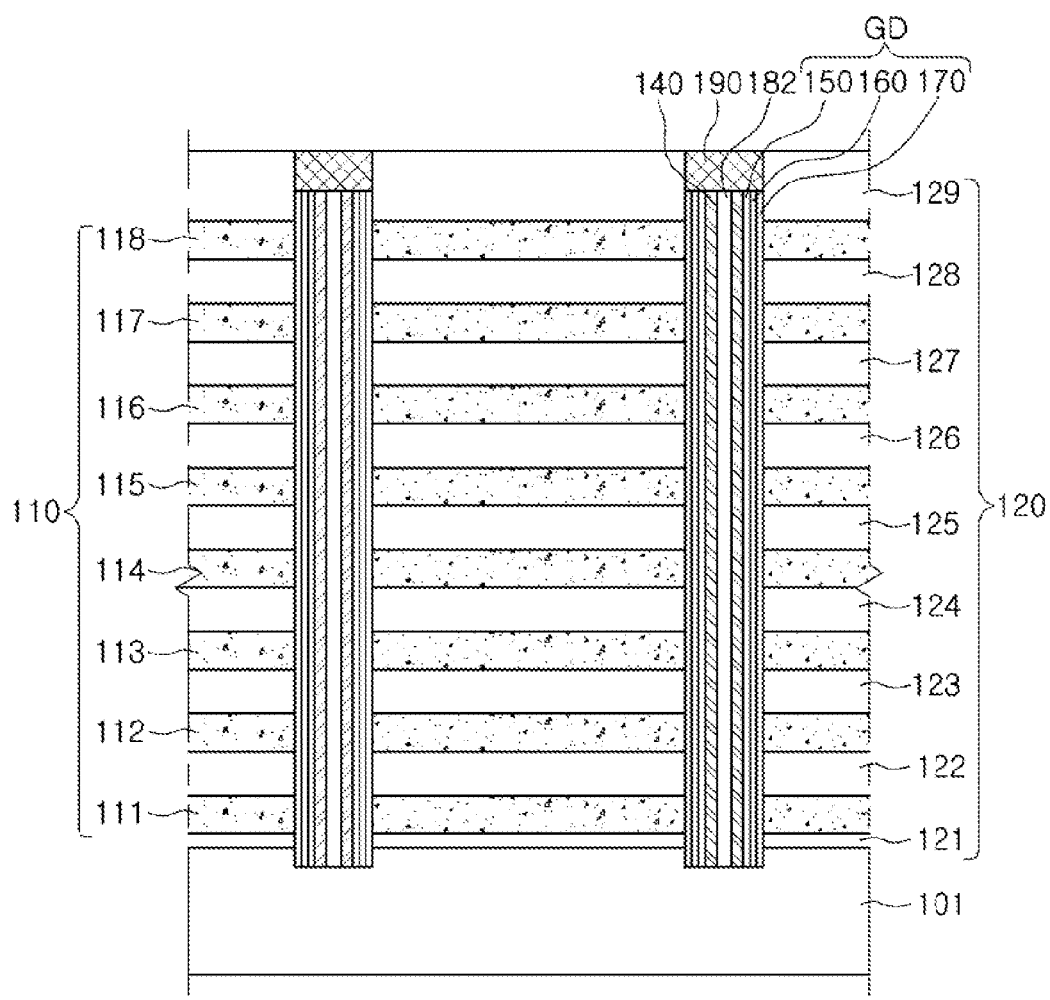

Referring to FIG. 11, after portions of the gate dielectrics GD are removed to expose corresponding portions of the substrate 101, the channel regions 140 may be formed on the gate dielectrics GD. Next, the first insulating layers 182 may be formed to fill the first openings OP1 and the drain pads 190 may be formed on the first insulating layers 182.

In order to bring the channel regions 140 into direct contact with the substrate 101, portions of the gate dielectrics GD formed on the substrate 101 within the first openings OP1 may be removed.

In other exemplary embodiments, the space inside the channel region 140 may be filled with conductive material rather than insulating material used to form the first insulating layer 182. The drain pads 190 may be formed of a conductive material. The drain pads 190 may be electrically connected to the channel regions 140, and may electrically connect the channel regions 140 to the bit lines BL1 to BLm to be formed in a subsequent process (see FIG. 2).

Figure 12:
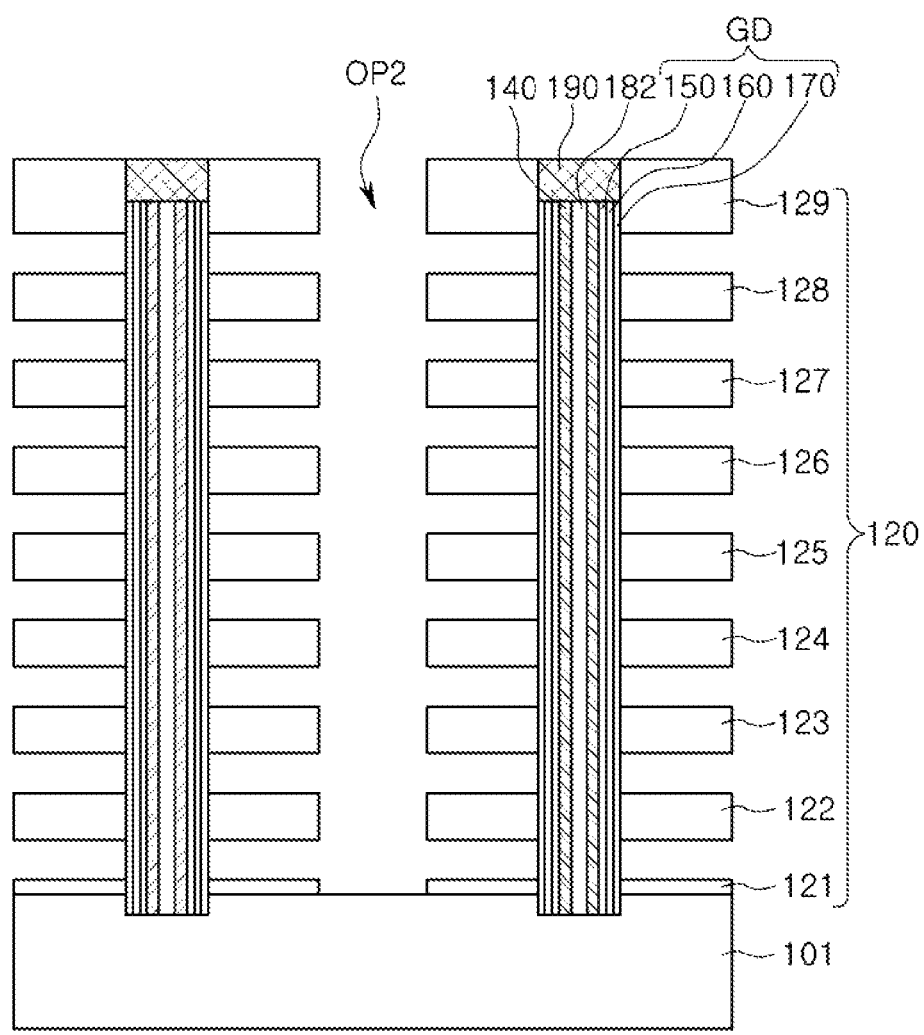

Referring to FIG. 12, a second opening OP2 may be formed to divide the stacked structure (including the interlayer sacrificial layers 110 and the interlayer insulating layers 120) into sections spaced from each other by a predetermined distance in a given direction, and the interlayer sacrificial layers 110 exposed through the second opening OP2 may be removed.

The second opening OP2 may be formed by forming a mask on the stacked structure using a photolithography process and anisotropically etching the stacked structure. The second opening OP2 may have the form of a trench extending in the y-axis direction (see FIG. 3). In exemplary embodiments, an additional insulating layer may be formed on the uppermost interlayer insulating layer 129 and the drain pad 190 prior to forming the second opening OP2, thereby preventing the drain pad 190 and the channel region 140 therebelow from being damaged. The second opening OP2 may expose a portion of the substrate 101 between the channel regions 140.

The interlayer sacrificial layers 110 may be removed by etching, and accordingly, a plurality of lateral openings may be formed between the interlayer insulating layers 120. Portions of sidewalls of the gate dielectrics GD may be exposed through the lateral openings.

In a case in which the aforementioned dummy channels together with the channel regions 140 are formed as spaced from each other by predetermined intervals, the dummy channels may stably support the interlayer insulating layers 120 so that they will not be bent even after the interlayer sacrificial layers 110 have been removed.

Figure 13:
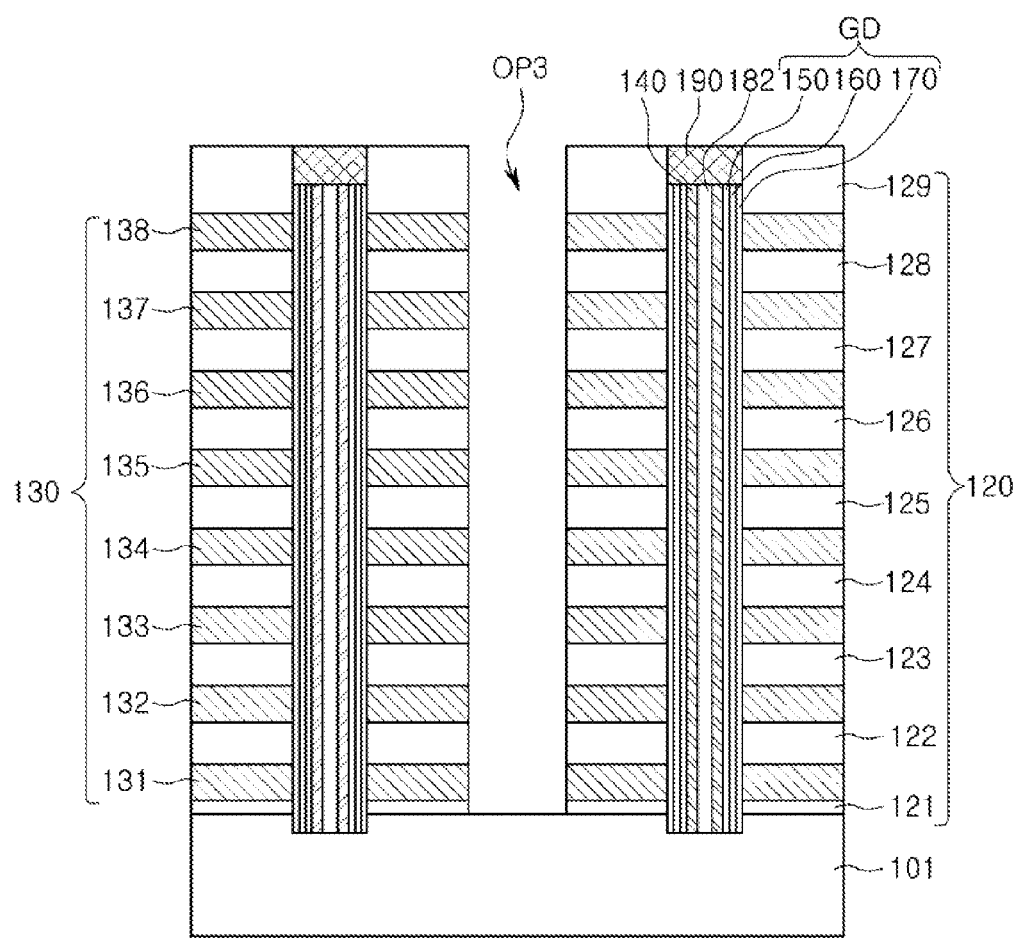

Referring to FIG. 13, the gate electrodes 130 may be formed inside the lateral openings, and then a third opening OP3 may be formed.

The gate electrodes 130 may include at least one of metal, polycrystalline silicon, and metal silicide. Examples of the metal silicide include silicides of Co, Ni, Hf, Pt, W and Ti. In a case in which the gate electrodes 130 are formed of a metal silicide, the gate electrodes 130 may be formed by filling the lateral openings with silicon and forming separate metal silicide layers.

After the gate electrodes 130 are formed, an additional removal process may be performed to remove some of the material forming the gate electrodes 130 so as to confine the gate electrodes 130 to the lateral openings, and thereby form the third opening OP3.

Referring to FIG. 13 together with FIG. 3, the source region 105 may then be formed in the substrate 101 within the third opening OP3, and the common source line 107 and the second insulating layer 184 may be formed on the source region 105.

The source region 105 may be formed by injecting impurities into a portion of the substrate 101 exposed through the third opening OP3. Next, the second insulating layer 184 may be formed on sides of the third opening OP3, and the common source line 107 may be formed. In exemplary embodiments, the source region 105 may be formed after forming the second insulating layer 184, or may include a high concentration doped region and low concentration doped regions formed in both end portions of the second insulating layer 184.

Then, the bit lines BL1 to BLm (see FIG. 2) may be formed to be connected to the drain pads 190. The bit lines BL1 to BLm may be elongated in the x-axis direction so as to connect the drain pads 190 arranged rows in the x-axis direction, and separate contact plugs may be further provided between the bit lines BL1 to BLm and the drain pads 190.

Figure 14:
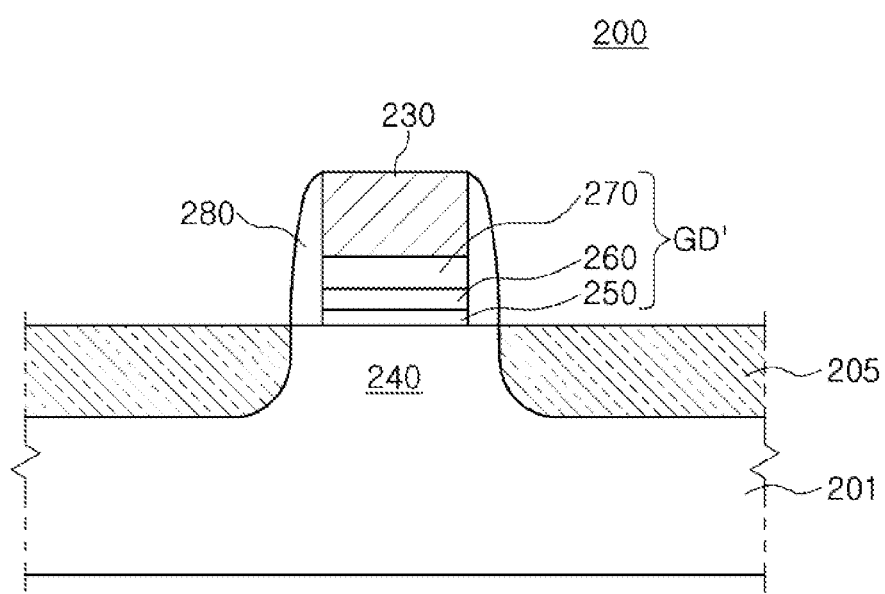
FIG. 14 is a cross-sectional view of another exemplary embodiment of a semiconductor device according to in the present inventive concept.

FIG. 14 illustrates another exemplary embodiment of a semiconductor device 200 according to the present inventive concept.

Semiconductor device 200 may include a substrate 201 having a channel region 240, a doped region 205 defining the channel region 240, a gate dielectric GD' formed on the substrate 201, and a gate electrode 230 formed on the gate dielectric GD'. The semiconductor device 200 may further include a spacer 280 disposed on sidewalls of the gate dielectric GD' and the gate electrode 230. The semiconductor device 200 may be a top gate-type thin film transistor, and may be a charge trapping transistor.

The substrate 201 may comprise a semiconductor material, such as group IV semiconductor, group III-V compound semiconductor, or group II-VI oxide semiconductor. Examples of group IV semiconductors include silicon, germanium and silicon-germanium. The substrate 201 may be a bulk wafer or may comprise an epitaxial layer.

The doped region 205 may be disposed to the sides of, i.e., laterally of, the gate dielectric GD' and the gate electrode 230. The doped region 205 may include a source region and a drain region of the transistor, and may contain p-type or n-type impurities.

The channel region 240 may be an active region defined by the doped region 205. A portion of the channel region 240 may form a channel of the transistor.

The gate electrode 230 may comprise polycrystalline silicon and/or a metal silicide. Examples of the metal silicide are silicides of Co, Ni, Hf, Pt, W and Ti. According to exemplary embodiments, the gate electrode 230 may comprise a metal, e.g., tungsten (W). Although not shown, a diffusion barrier may be provided for the gate electrode 230. The diffusion barrier may comprise at least one layer of material selected from the group consisting of tungsten nitride (WN), tantalum nitride (TaN) and titanium nitride (TiN).

The gate dielectric GD' may be disposed between the gate electrode 230 and the channel region 240. The gate dielectric GD' may include a tunneling layer 250, a charge storage layer 260, and a blocking layer 270 disposed in the foregoing order on the channel region 240.

The tunneling layer 250 may allow charges to tunnel to the charge storage layer 260 using a Fowler-Nordheim (F-N) tunneling mechanism. To this end, the tunneling layer 250 may comprise a silicon oxide. More specifically, the nitrogen concentration of the tunneling layer 250 may vary in a direction perpendicular to the upper surface of the channel region 240, and may be maximal at a location offset from the center of the tunneling layer 250 toward the charge storage layer 260. Due to such characteristics of the tunneling layer 250, the erase characteristics may be secured even at relatively low voltage, and charge loss may be reduced. This will be explained in more detail with reference to FIGS. 15A and 15B.

The charge storage layer 260 may be a charge trapping layer or a floating gate conductive layer. In a case in which the charge storage layer 260 serves as a charge trapping layer, the charge storage layer 260 may be formed of a silicon nitride.

The blocking layer 270 may include a high-k dielectric material. High-k dielectric material refers to a dielectric material having a dielectric constant higher than that of silicon dioxide.

The spacer 280 may be disposed to protect and insulate the gate electrode 230 and the gate dielectric GD' from layers to be formed in subsequent processes, and may comprise a layer of silicon nitride or silicon oxide.

Figure 15A:
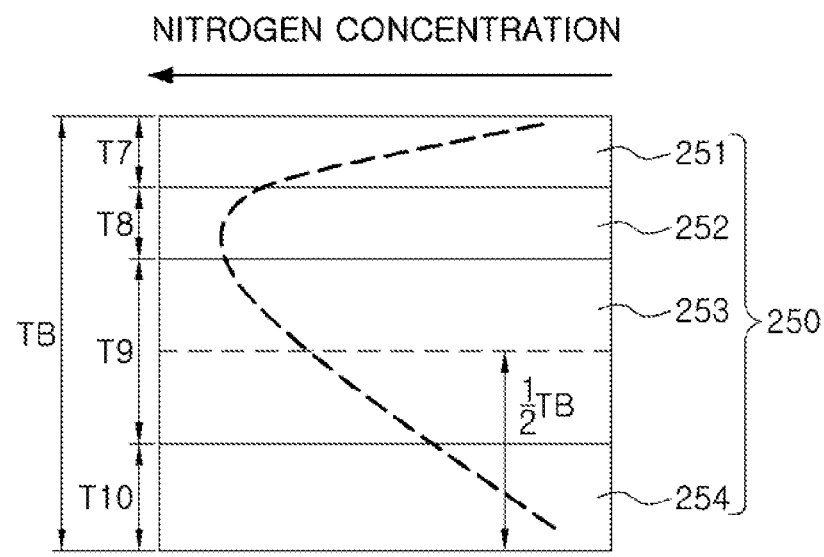
FIGS. 15A and 15B are graphs of examples of nitrogen concentration distributions in tunneling layers of the exemplary embodiment of FIG. 14 according to the present inventive concept.
Figure 15B:
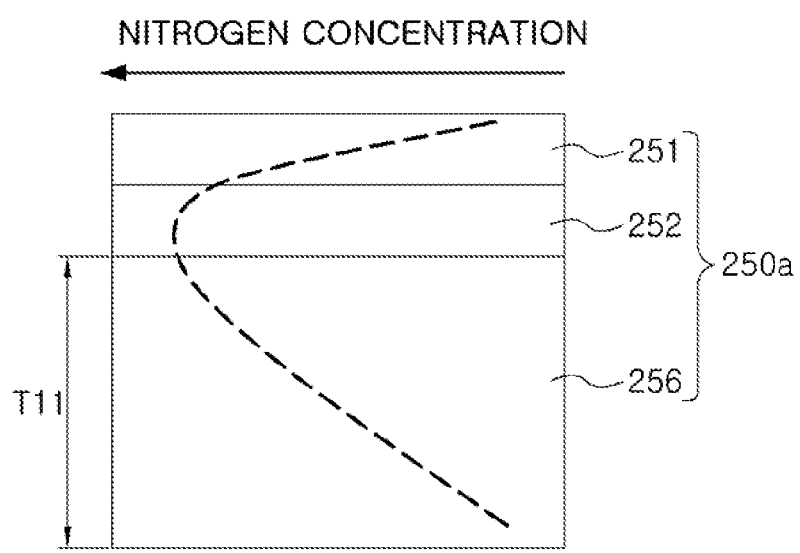

FIGS. 15A and 15B illustrate examples of tunneling layers that may be employed by the embodiment of FIG. 14 according to the present inventive concept.

Referring to FIG. 15A, the tunneling layer 250 may include first to fourth regions 251, 252, 253 and 254 sequentially disposed on the charge storage layer 260. For example, the tunneling layer 250 may be formed of silicon oxynitride (SiON), and the first to fourth regions 251, 252, 253 and 254 may have different nitrogen concentrations. A nitrogen concentration distribution in the tunneling layer 250 may increase from the first region 251 to the second region 252 and may decrease in the third and fourth regions 253 and 254.

The second region 252 may have the highest nitrogen concentration, and the third region 253 including the center of the tunneling layer 250 in the direction of thickness of the tunneling layer 250 may have the next highest nitrogen concentration.

The first region 251 may be formed of silicon dioxide ($SiO_2$). However, in this case, the charge storage layer 260 is in contact with the first region 251 and comprises silicon nitride (SiN). Accordingly, nitrogen diffuses from the charge storage layer 260 or the second region 252 into the first region 251 due to heat or the like applied during the manufacturing process such that the first region 251 includes nitrogen at a relatively low concentration.

The nitrogen concentration of the fourth region 254 in contact with the channel region 240 may be lower than the nitrogen concentration of the second and third regions 252 and 253, and may be higher than the nitrogen concentration of the first region 251. In exemplary embodiments, a heat treatment or the like may be performed after forming the fourth region 254, and thus, a region having a relatively low nitrogen concentration may be further formed in a top or bottom portion of the first layer 251 or the fourth layer 254.

The first to fourth regions 251, 252, 253 and 254 may have respective thicknesses T7, T8, T9, and T10. The thicknesses T7 and T8 may be similar to each other. The thickness T9 may be greater than the thicknesses T7 and T8. The thickness T10 may be less than the thickness T9. The third region 253 may include the center of the tunneling layer 250 in the thickness direction of the layer, and the second region 252 having the highest nitrogen concentration may be offset towards the charge storage layer 260 from the center, i.e., closer towards the charge storage layer 260 than the channel region 240.

Referring to FIG. 15B, the tunneling layer 250a may include first to third regions 251, 252, and 256 sequentially disposed on the charge storage layer 260. For example, the tunneling layer 250a may be formed of silicon oxynitride (SiON), and the first to third regions 251, 252, and 256 may have different nitrogen concentrations. A nitrogen concentration distribution in the tunneling layer 250a may increase from the first region 251 to the second region 252 and may decrease in the third region 256.

In the present exemplary embodiment, the tunneling layer 250a may include a total of three regions unlike the embodiment of FIG. 15A, and the three regions may be formed using different manufacturing methods. In the present exemplary embodiment, the nitrogen concentration of the third region 256 may be lower than the nitrogen concentration of the second region 252. The nitrogen concentration of the third region 256 may be lower or higher than the nitrogen concentration of the first region 251. A thickness T11 of the third region 256 may be equal to or similar to the sum of the thicknesses T9 and T10 in the embodiment of FIG. 15A.

Figure 16:
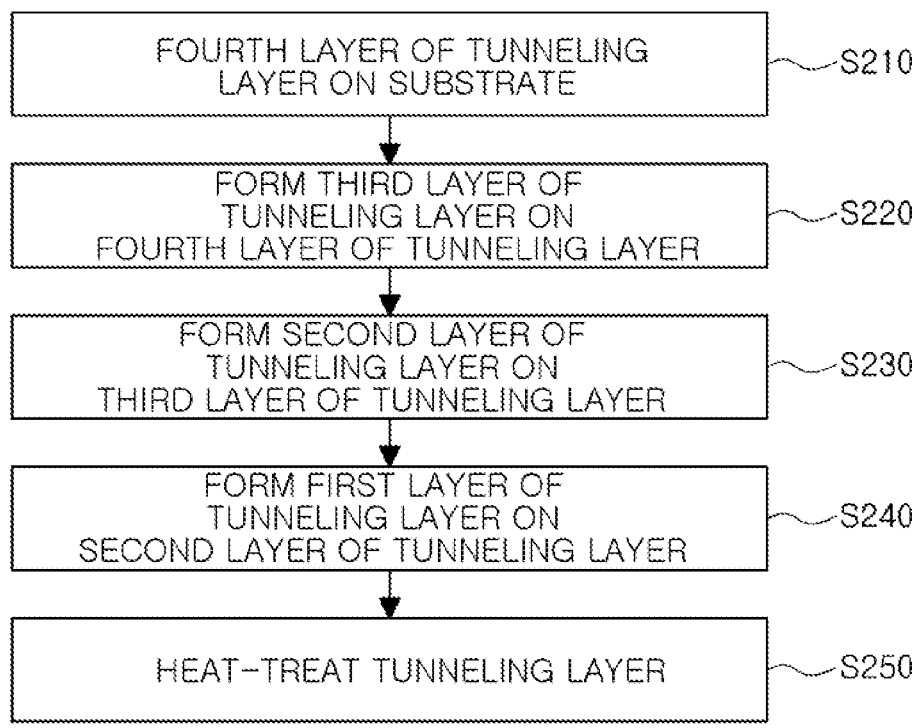
FIG. 16 is a flowchart of a process of manufacturing a tunneling layer having the nitrogen concentration distribution of FIG. 15A according to the present inventive concept.

FIG. 16 illustrates a method of manufacturing the tunneling layer of FIG. 15A, as an example of the tunneling layer of the embodiment of FIG. 14, according to the present inventive concept.

Referring to FIG. 16 together with FIG. 15A, the manufacturing of the tunneling layer 250 may include: forming the fourth region 254 on the substrate 201 (S210); forming the third region 253 on the fourth region 254 (S220); forming the second region 252 on the third region 253 (S230); forming the first region 251 on the second region 252 (S240); and performing a heat treatment on the resultant tunneling layer 250 (S250). Note, in FIG. 16, each region is referred to as its own layer because each region has the form of a layer as it is being produced.

In exemplary embodiments, some of the nitrogen in the first region 251 or the fourth region 254 may diffuse out of the region due to the heat treatment, and thus, a layer having a relatively low nitrogen concentration may be formed at the top or bottom of the first region 251 or the fourth region 254. However, the heat treatment of the tunneling layer 250 may be omitted.

The first to fourth region 251, 252, 253 and 254 may be formed by controlling the amounts of oxygen and nitrogen supplied into a processing chamber and/or the time periods in which the oxygen and nitrogen are supplied so as to vary the nitrogen concentrations from region to region. In particular, in exemplary embodiments, the first to fourth layers 251, 252, 253 and 254 may be formed in-situ while at least one of the time during which an oxygen source gas and the time of during which a nitrogen source gas is/are varied, thereby changing the nitrogen concentration of the material being deposited over the course of the deposition process (e.g., an ALD process).

Figure 17:
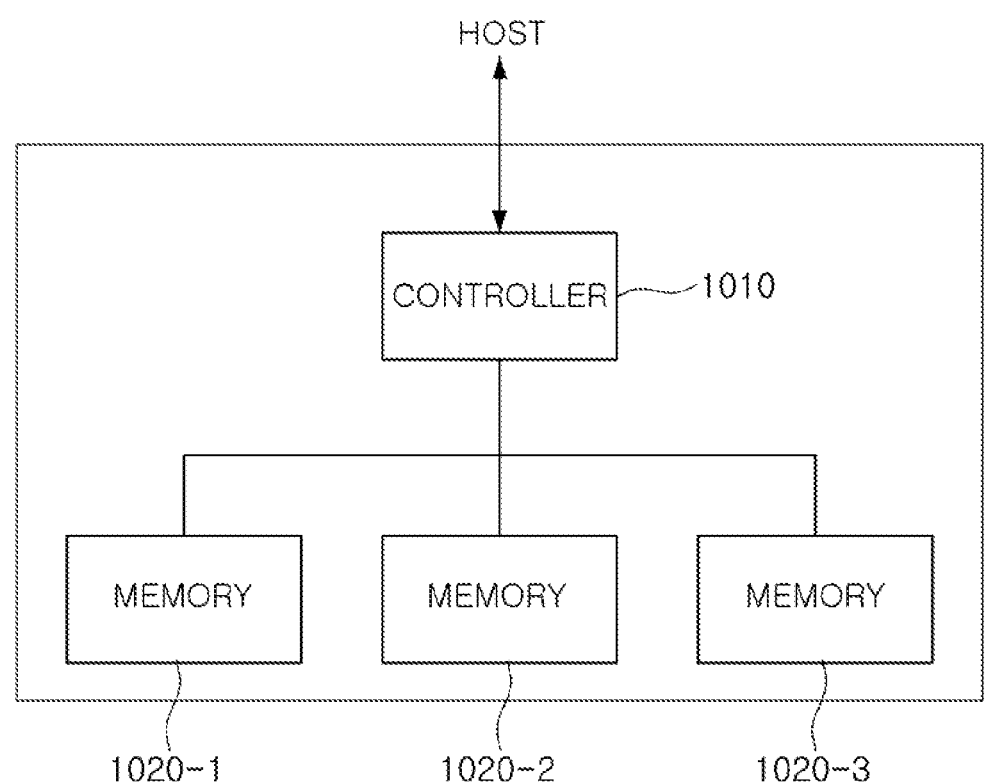
FIG. 17 is a block diagram of a storage device including a semiconductor device according to the present inventive concept.

FIG. 17 illustrates a storage device including a semiconductor device according to the present inventive concept.

Referring to FIG. 17, a storage device 1000 according to this exemplary embodiment may include a controller 1010 communicating with a host HOST and memories 1020-1, 1020-2, and 1020-3 storing data. Each of the memories 1020-1, 1020-2, and 1020-3 may include at least one of the semiconductor devices according to the exemplary embodiments described above with reference to FIGS. 1 through 6C and FIGS. 14 through 15B.

The host HOST communicating with the controller 1010 may be any of various electronic devices in which the storage device 1000 is installed. For example, the host HOST may be a smartphone, a digital camera, a desktop computer, a laptop computer, a media player, or the like. When a data write or read request is received from the host HOST, the controller 1010 may store data in the memories 1020-1, 1020-2, and 1020-3 or generate a command CMD to retrieve data from the memories 1020-1, 1020-2, and 1020-3.

As illustrated in FIG. 17, one or more memories 1020-1, 1020-2, and 1020-3 may be connected to the controller 1010 in parallel within the storage device 1000. By connecting the plurality of memories 1020-1, 1020-2, and 1020-3 to the controller 1010 in parallel, the storage device 1000 can store mass amounts of date and hence, may be realized as a solid state drive (SSD).

Figure 18:
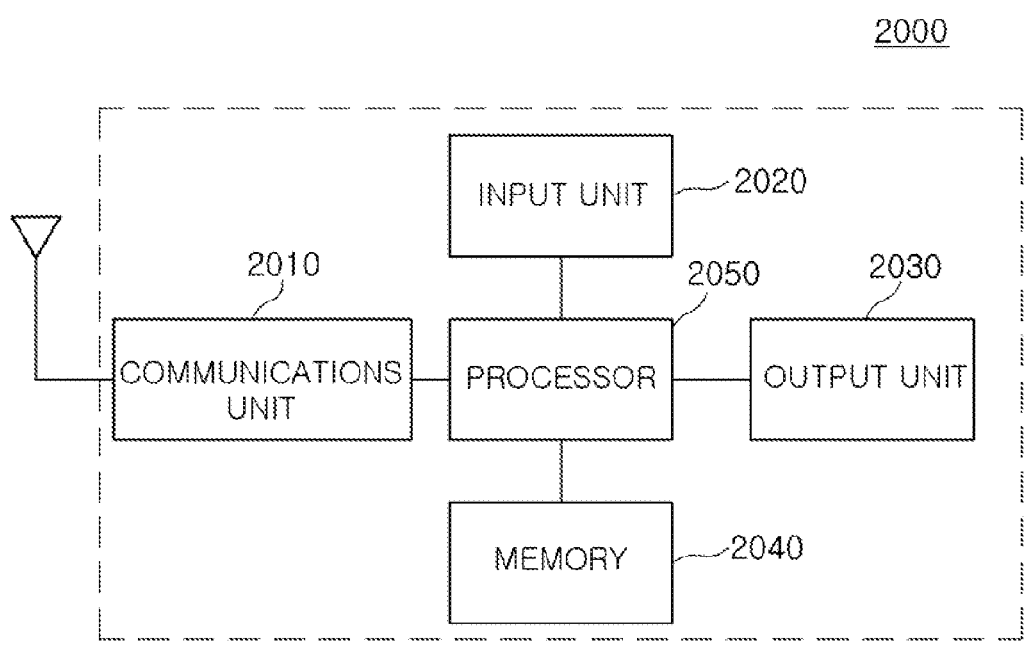
FIG. 18 is a block diagram of an electronic device including a semiconductor device according to the present inventive concept.

FIG. 18 illustrates an electronic device including a semiconductor device according to the present inventive concept.

Referring to FIG. 18, an electronic device 2000 according to this exemplary embodiment may include a communications unit 2010, an input unit 2020, an output unit 2030, a memory 2040, and a processor 2050.

The communications unit 2010 may include a wired/wireless communications module, and may include a wireless Internet module, a short-range communications module, a global positioning system (GPS) module, a mobile communications module, or the like. The wired/wireless communications module of the communications unit 2010 may be connected to an external communication network based on various communication standards to transmit and receive data.

The input unit 2020, provided to allow a user to control an operation of the electronic device 2000, may include a mechanical switch, a touchscreen, a voice recognition module, or the like. Also, the input unit 2020 may include a mouse employing a track ball, an optical mouse, a finger mouse, or the like. The input unit 2020 may further include any of various sensor modules allowing the user to input data.

The output unit 2030 outputs information processed in the electronic device 2000 in an audio or video format, and the memory 2040 may store a program for processing and controlling of the processor 2050, data, or the like. The memory 2040 may include at least one of the semiconductor devices according to the exemplary embodiments as described above with reference to FIGS. 1 through 6C and FIGS. 14 through 15B. The processor 2050 may deliver a command to the memory 2040 according to a necessary operation in order to store data in the memory 2040 or retrieve data therefrom.

The memory 2040 may be installed in the electronic device 2000 or communicate with the processor 2050 through a separate interface. In a case in which the memory 2040 communicates with the processor 2050 through a separate interface, the processor 2050 may store data in the memory 2040 or retrieve data therefrom through various interface standards such as SD, SDHC, SDXC, MICRO SD, or USB.

The processor 2050 controls operations of respective components of the electronic device 2000. The processor 2050 may perform controlling and processing related to an audio call, a video call, data communications, and the like, or may perform controlling and processing for multimedia playback and management. Also, the processor 2050 may process an input delivered from the user through the input unit 2020, and output corresponding results through the output unit 2030. Furthermore, as described above, the processor 2050 may store data required for controlling the operation of the electronic device 2000 in the memory 2040 or retrieve the data therefrom.

Figure 19:
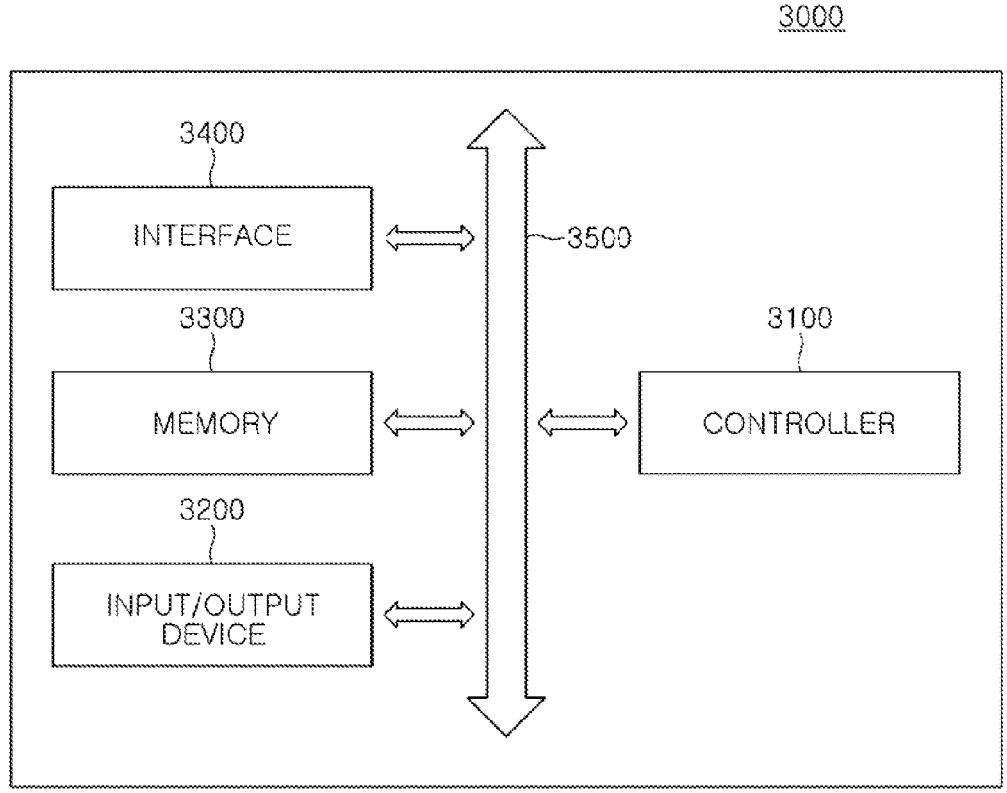
FIG. 19 is a block diagram of a system including a semiconductor device according to the present inventive concept.

FIG. 19 illustrates a system including a semiconductor device according to the present inventive concept.

Referring to FIG. 19, a system 3000 may include a controller 3100, an input/output device 3200, a memory 3300 and an interface 3400. The system 3000 may be a mobile system or a system for transmitting or receiving information. The mobile system may be a personal digital assistant (PDA), a portable computer, a web tablet, a wireless phone, a mobile phone, a digital music player or a memory card.

The controller 3100 may serve to operate a program and control the system 3000. For example, the controller 3100 may be a microprocessor, a digital signal processor, a microcontroller or the like.

The input/output device 3200 may be used to input or output data of the system 3000. The system 3000 may be connected to an external device such as a personal computer or a network through the input/output device 3200 to exchange data with the external device. For example, the input/output device 3200 may be a keypad, a keyboard or a display device.

The memory 3300 may store code and/or data for the operation of the controller 3100 and/or may store data processed by the controller 3100. The memory 3300 may include at least one of the semiconductor devices according to the exemplary embodiments.

The interface 3400 may serve as a data transmission path between the system 3000 and external devices. The controller 3100, the input/output device 3200, the memory 3300 and the interface 3400 may communicate with each other through a bus 3500.

At least one of controller 3100 and the memory 3300 may include at least one of the semiconductor devices according to the exemplary embodiments described above with reference to FIGS. 1 through 6C and FIGS. 14 through 15B.

As described above, a semiconductor device and a method of manufacturing the same according to exemplary embodiments of the present inventive concept may have improved reliability in the form of enhanced erase characteristics and minimal charge loss due to its tunneling layer having a region of highest nitrogen concentration being relative close to its charge storage layer.

While exemplary embodiments have been shown and described above, it will be apparent to those skilled in the art that modifications and variations could be made without departing from the scope of the present invention as defined by the appended claims.

What is claimed is:

1. A semiconductor device, comprising:
a channel region;
a gate dielectric including a tunneling layer, a charge storage layer and a blocking layer disposed on a surface of the channel region in the foregoing order such that the tunneling layer abuts the surface of the channel region; and
a gate electrode disposed on the gate dielectric,
wherein the tunneling layer comprises nitrogen throughout,
the nitrogen concentration of the tunneling layer varies along an axis normal to the surface of the channel region, and
the nitrogen concentration of the tunneling layer is maximum only at a location offset from a center of the tunneling layer, in a direction along the axis toward the charge storage layer wherein the tunneling layer has a first region, a second region, and a third region disposed in the foregoing order in a direction along said axis from the charge storage layer, the second region has a higher nitrogen concentration than each of the first and third regions, and the third region of the tunneling layer includes the center of the tunneling layer.

2. The semiconductor device of claim 1, wherein the nitrogen concentration increases from the first region to the second region and decreases in the third region in said direction.

3. The semiconductor device of claim 1, wherein the nitrogen concentration of the second region ranges from 22 atomic percent to 28 atomic percent.

4. The semiconductor device of claim 1, wherein the tunneling layer also has a fourth region in contact with the third region, and a fifth region in contact with the fourth region and with a nitrogen concentration different from that of the fourth region.

5. The semiconductor device of claim 4, wherein the nitrogen concentration of each of the fourth region and the fifth region is lower than that of the third region.

6. The semiconductor device of claim 4, wherein the nitrogen concentration of the fifth region is lower than that of the fourth region.

7. The semiconductor device of claim 4, wherein the third region is thicker than any of the other said regions of the tunneling layer.

8. The semiconductor device of claim 1, wherein the maximum nitrogen concentration of the tunneling layer ranges from 25 atomic percent to 30 atomic percent.

9. The semiconductor device of claim 1, wherein the tunneling layer has a surface that contacts the charge storage layer, and
the maximum nitrogen concentration is located at a distance equal to 25% to 40% of the thickness of the tunneling layer in said direction from a surface of the tunneling layer that contacts the charge storage layer.

10. A semiconductor device, comprising:
a stack of gate electrodes and interlayer insulating layers on a substrate, wherein the gate electrodes are disposed alternately with the interlayer insulating layers in the stack;
channel regions extending through the stack; and
a gate dielectric including a tunneling layer, a charge storage layer, and a blocking layer stacked in the foregoing order around a vertical surface of each of the channel regions such that the tunneling layer abuts the surface of each of the channel regions, and
wherein the tunneling layer of the gate dielectric comprises nitrogen throughout,
the nitrogen concentration of the tunneling layer varies along an axis normal to the vertical surface of the channel region, and
the nitrogen concentration of the tunneling layer is maximum only at a location offset from a center of the tunneling layer, along said axis, toward the charge storage layer wherein the tunneling layer has a first region, a second region, and a third region disposed in the foregoing order in a direction along said axis from the charge storage layer, the second region has a higher nitrogen concentration than each of the first and third regions, and the third region of the tunneling layer includes the center of the tunneling layer.

11. The semiconductor device of claim 10, wherein the nitrogen concentration of the tunneling layer increases and then decreases in a direction along said axis from the charge storage layer to the channel region.

12. A semiconductor device, comprising:
a channel region of semiconductor material;
a gate electrode; and
a tunneling layer, a charge storage layer and a blocking layer collectively interposed between a surface of the channel region and the gate electrode,
wherein the tunneling layer abuts the channel region and is interposed between the charge storage layer and the channel region, and the blocking layer is interposed between the charge storage layer and the gate electrode,
the tunneling layer comprises nitrogen throughout,
the nitrogen concentration of the tunneling layer varies substantially in a direction from the charge storage layer to the channel region, and
the nitrogen concentration of the tunneling layer is maximum only at a location in the tunneling layer between a center of the tunneling layer and the charge storage layer wherein the tunneling layer has a first region, a second region, and a third region disposed in the foregoing order in a direction along said axis from the charge storage layer, the second region has a higher nitrogen concentration than each of the first and third regions, and the third region of the tunneling layer includes the center of the tunneling layer.

13. The semiconductor device of claim 12,
wherein the nitrogen concentration of the tunneling layer has one region in which the nitrogen concentration thereof increases towards said location, and another region in which the nitrogen concentration thereof decreases away from said location.

14. The semiconductor device of claim 13,
wherein said tunneling layer has a surface contacting the charge storage layer, and said location at which the nitrogen concentration of the tunneling layer is maximum is spaced by a distance equal to 25% to 40% of a thickness of the tunneling layer from the surface of the tunneling layer contacting the charge storage layer.

15. The semiconductor device of claim 12,
wherein the nitrogen concentration of the tunneling layer at said location is within a range of 25 atomic percent to 30 atomic percent.

16. The semiconductor device of claim 1, wherein the tunneling layer directly contacts the charge storage layer.

17. The semiconductor device of claim 10, wherein the tunneling layer directly contacts the charge storage layer.

18. The semiconductor device of claim 12, wherein the tunneling layer directly contacts the charge storage layer.

* * * * *